United States Patent
Yoshihiro et al.

(10) Patent No.: US 7,450,817 B2
(45) Date of Patent: Nov. 11, 2008

(54) MAGNETIC TAPE RECORDING APPARATUS

(75) Inventors: Toshitaka Yoshihiro, Kanagawa (JP);
Fumiyoshi Abe, Kanagawa (JP)

(73) Assignee: Sony Corporation, Tokyo (JP)

( * ) Notice: Subject to any disclaimer, the term of this patent is extended or adjusted under 35 U.S.C. 154(b) by 944 days.

(21) Appl. No.: 10/363,715

(22) PCT Filed: Apr. 9, 2002

(86) PCT No.: PCT/JP02/03518
§ 371 (c)(1),
(2), (4) Date: Jul. 18, 2003

(87) PCT Pub. No.: WO02/084663
PCT Pub. Date: Oct. 24, 2002

(65) Prior Publication Data
US 2004/0008444 A1    Jan. 15, 2004

(30) Foreign Application Priority Data
Apr. 12, 2001   (JP) .............................. 2001-113987

(51) Int. Cl.
*H04N 5/91* (2006.01)

(52) U.S. Cl. .......................................... 386/68; 386/81

(58) Field of Classification Search ...................... 386/1, 386/33, 67, 111–112, 69
See application file for complete search history.

(56) References Cited

U.S. PATENT DOCUMENTS

| | | | | |
|---|---|---|---|---|
| 5,973,868 A | * | 10/1999 | Kanota et al. .................. | 360/48 |
| 6,026,212 A | * | 2/2000 | Oguro .......................... | 386/67 |
| 6,141,486 A | * | 10/2000 | Lane et al. .................... | 386/68 |
| 6,141,487 A | * | 10/2000 | Yanagawa et al. ............. | 386/69 |

FOREIGN PATENT DOCUMENTS

| | | |
|---|---|---|
| JP | 7-288774 | 10/1995 |
| JP | 8-140030 | 5/1996 |
| JP | 8-214252 | 8/1996 |

* cited by examiner

*Primary Examiner*—Thai Tran
*Assistant Examiner*—Tat Chi Chio
(74) *Attorney, Agent, or Firm*—Frommer Lawerence & haug LLP; William S. Frommer; Thomas F. Presson

(57) ABSTRACT

The invention relates to a magnetic tape recording apparatus which can record digital image data sufficient to allow a good image to be displayed upon variable speed reproduction in the long time mode. When image data for variable speed reproduction (for example, sixteenfold speed reproduction) is recorded discretely at positions which are traced by a rotary head upon variable speed reproduction, in the long time mode, the number of recording times of image data for same variable speed reproduction is increased and the number of sync blocks recorded in one recording operation is decreased when compared with those in recording in the standard mode. For example, in the standard mode, six sync blocks are recorded three times, but in the long time mode, four sync blocks are recorded four times. The present invention can be applied to a recording and reproduction apparatus which displays a good image upon variable speed reproduction.

6 Claims, 28 Drawing Sheets

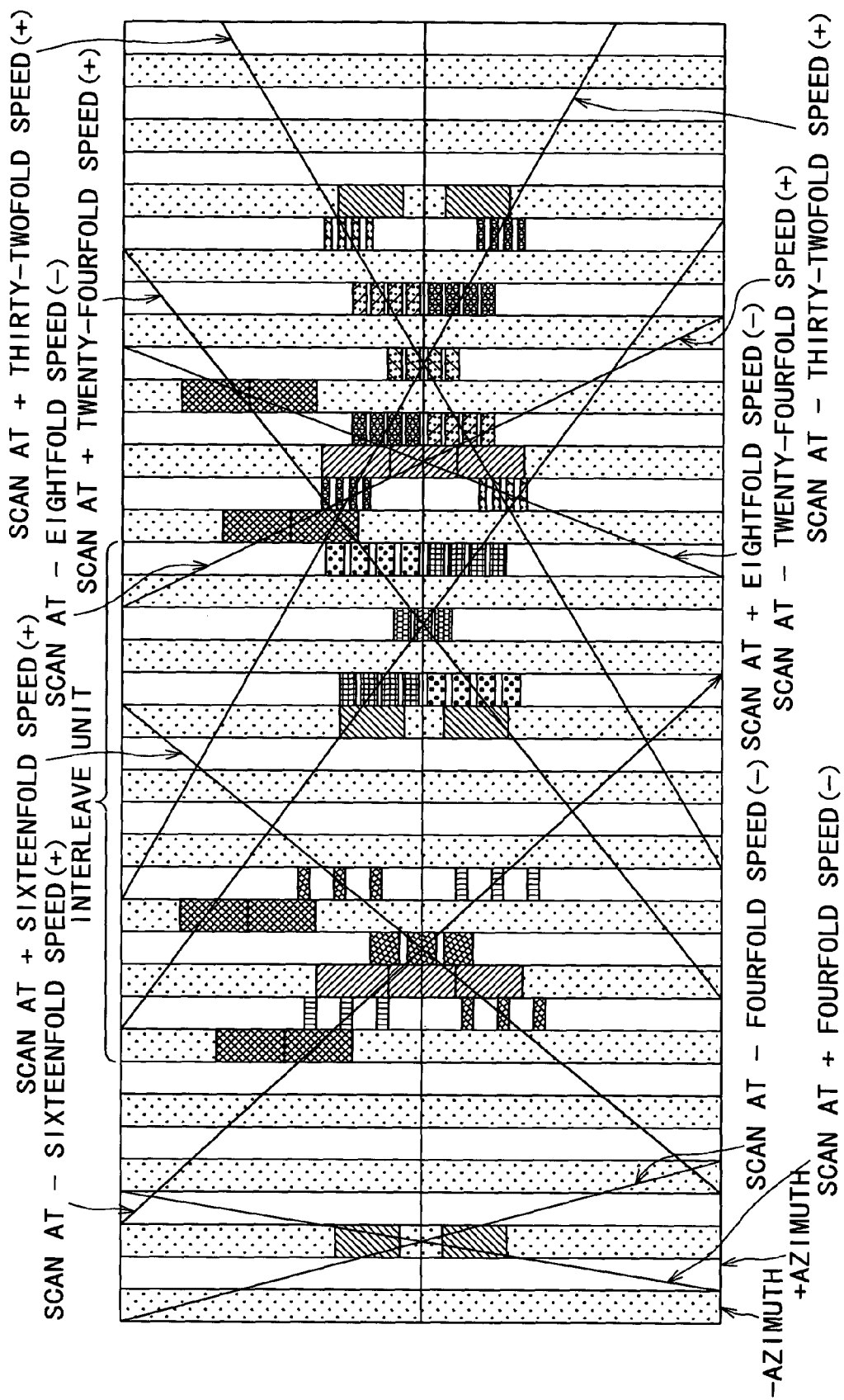

F I G. 2 1
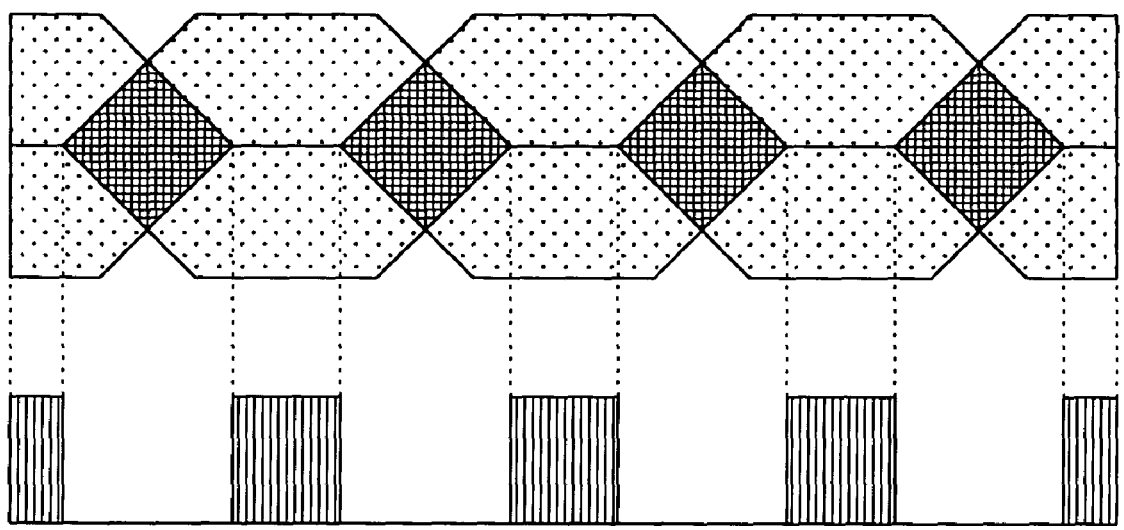

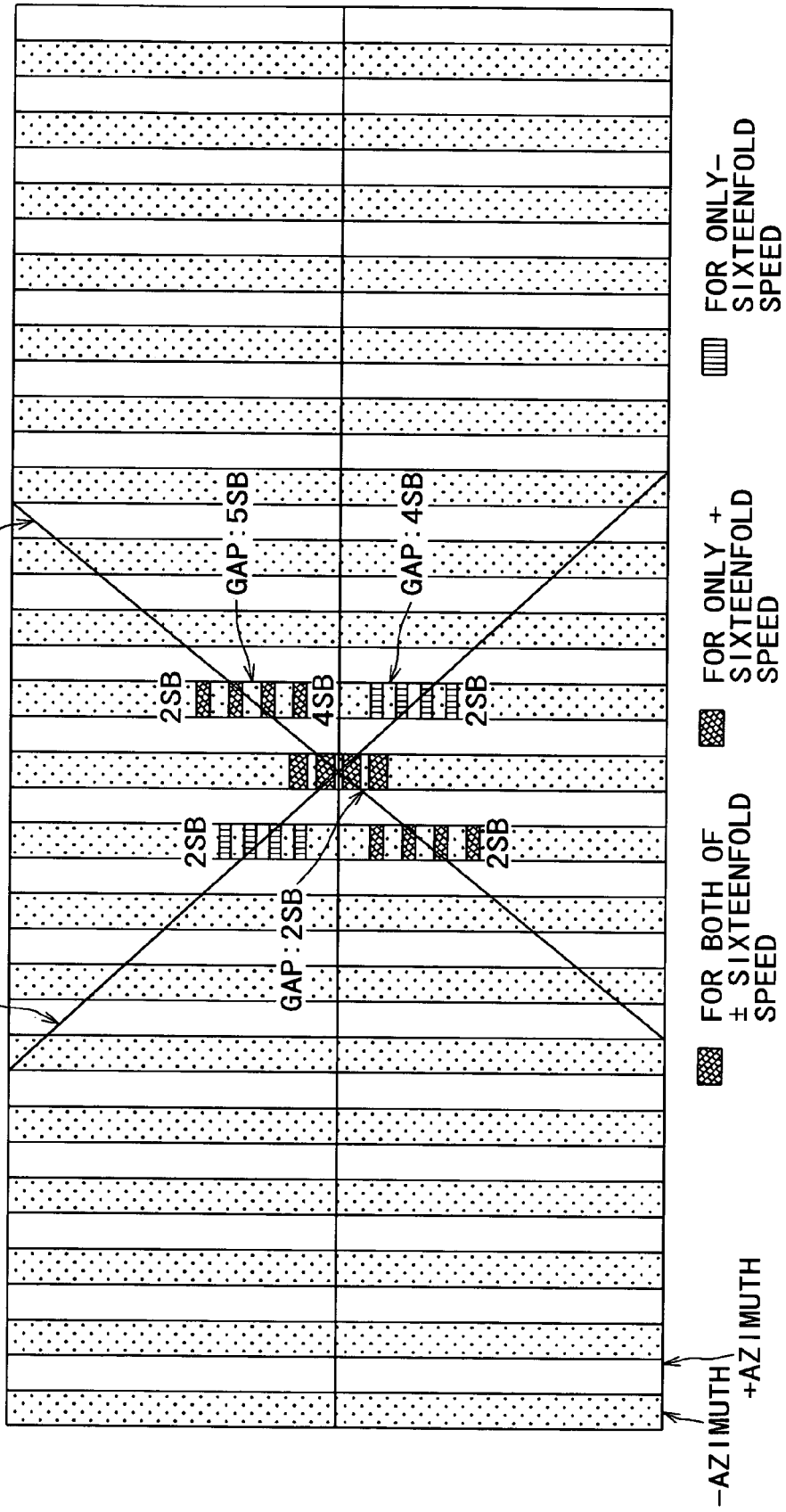

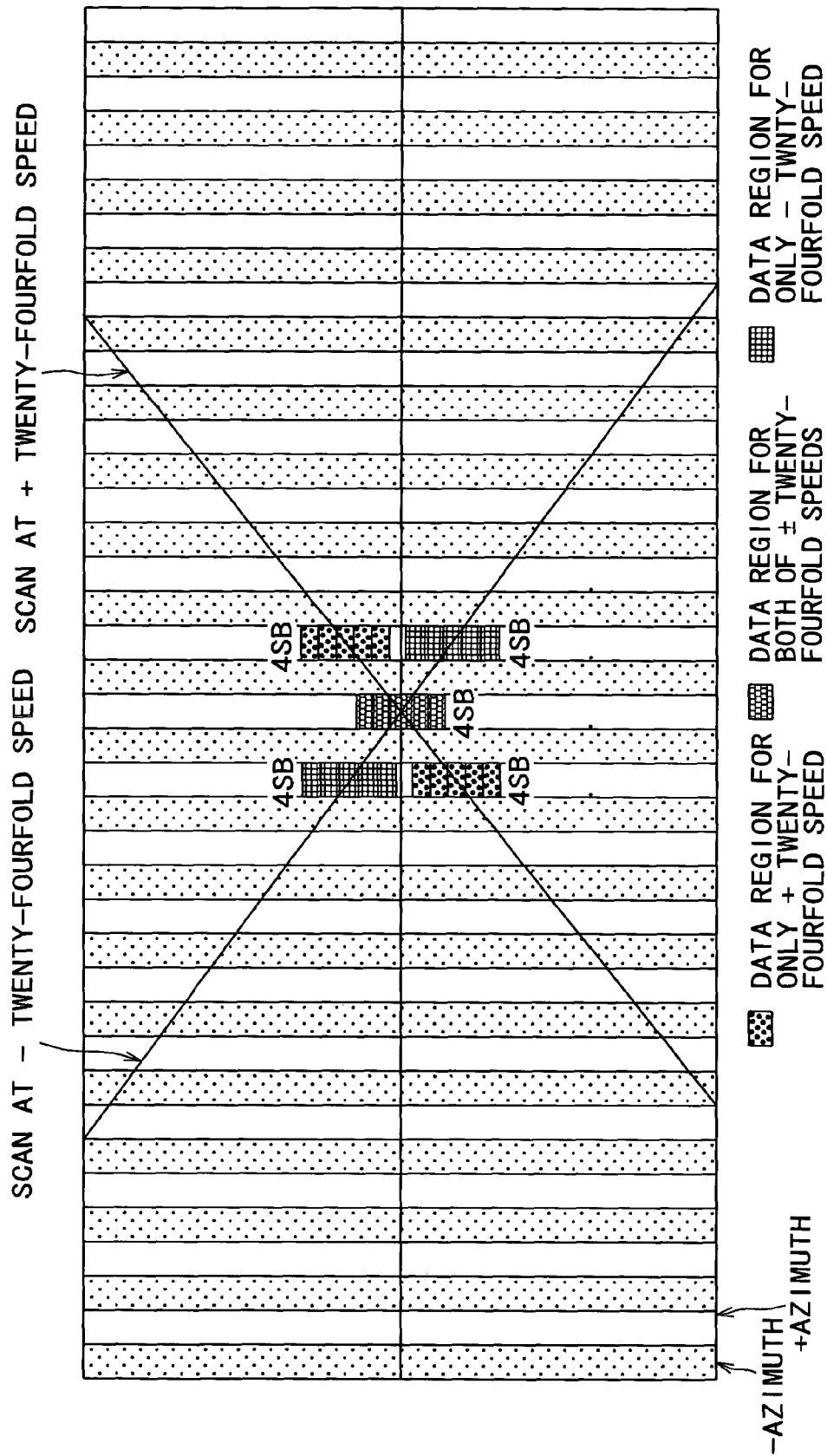

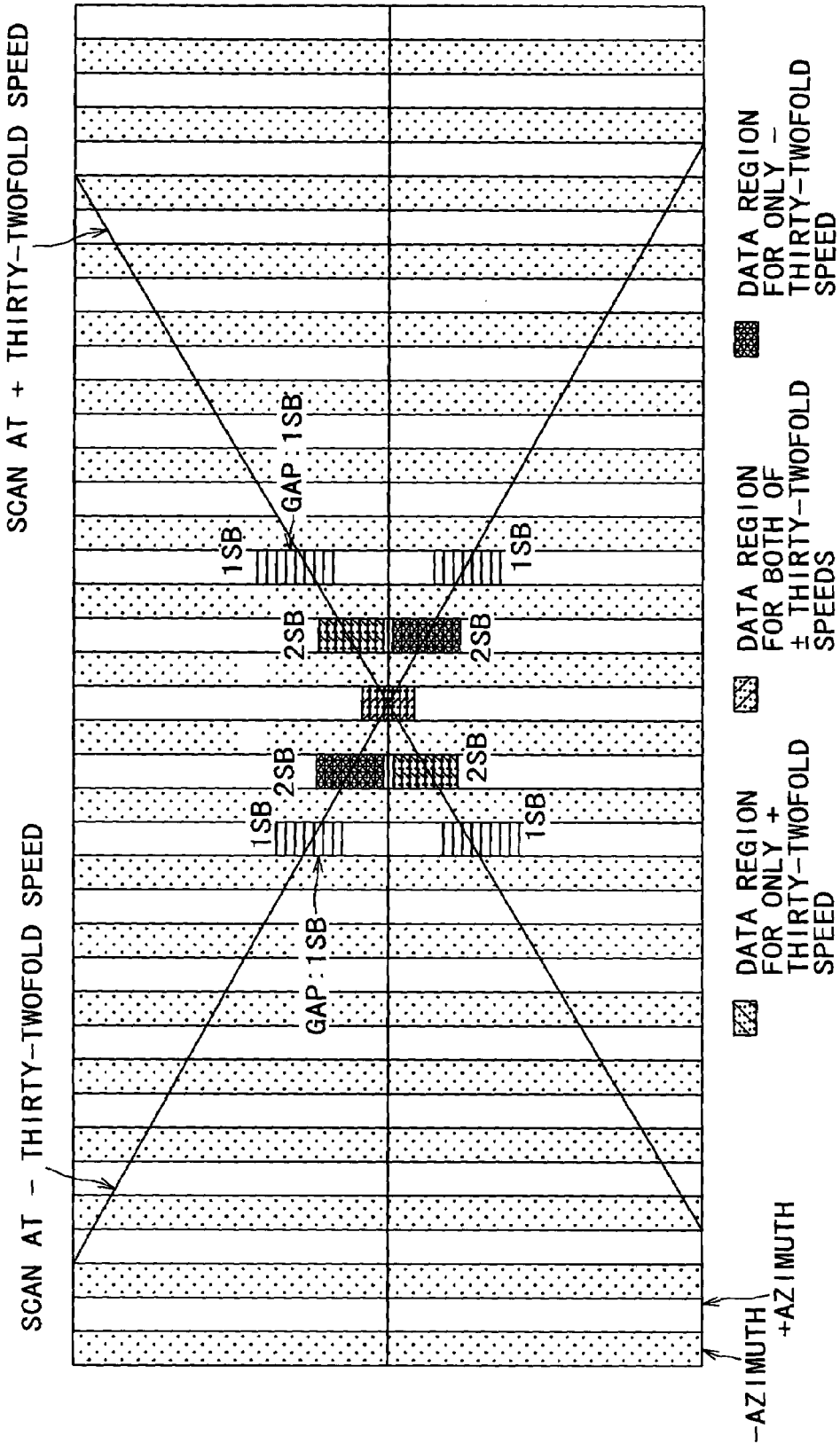

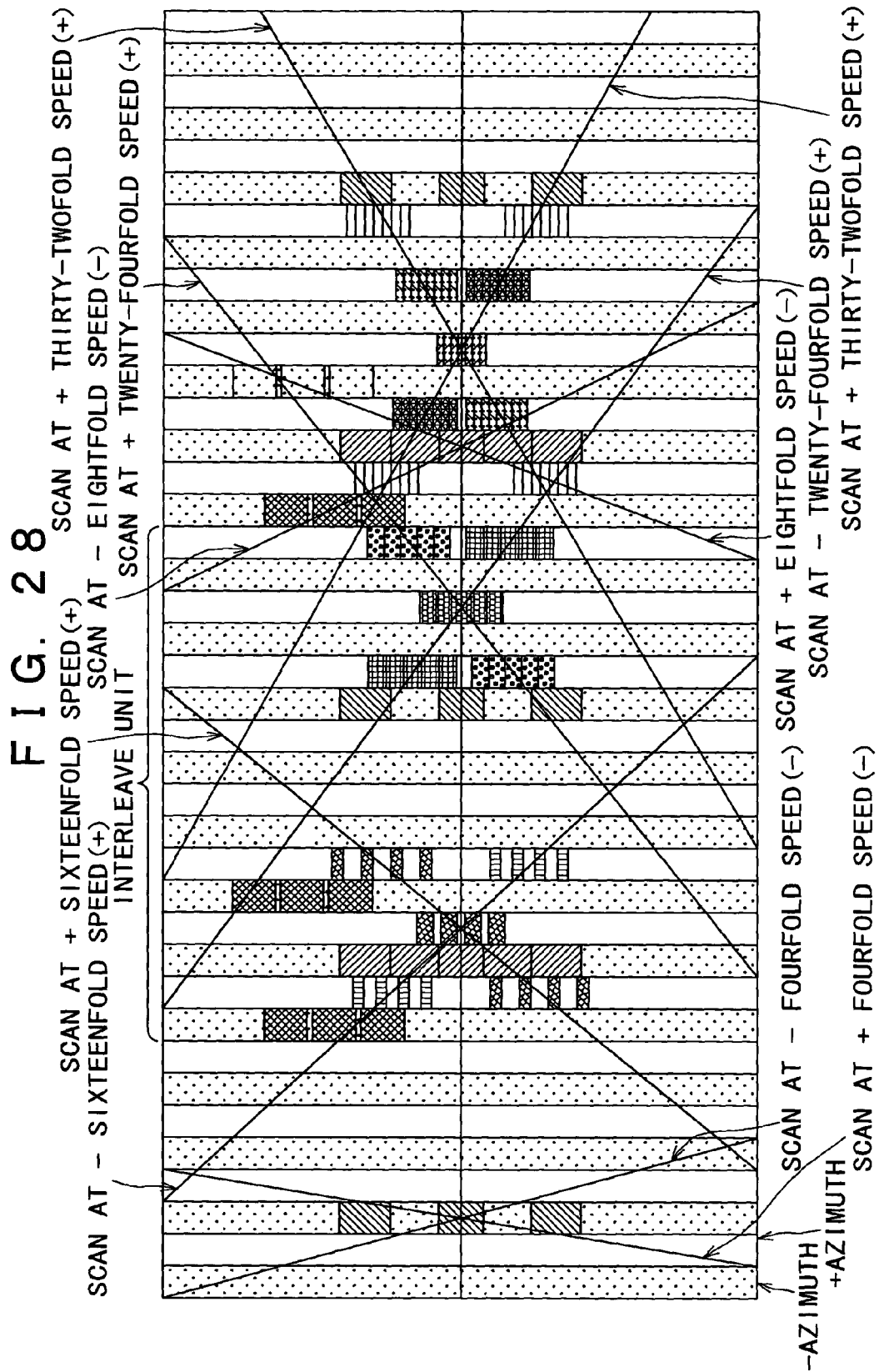

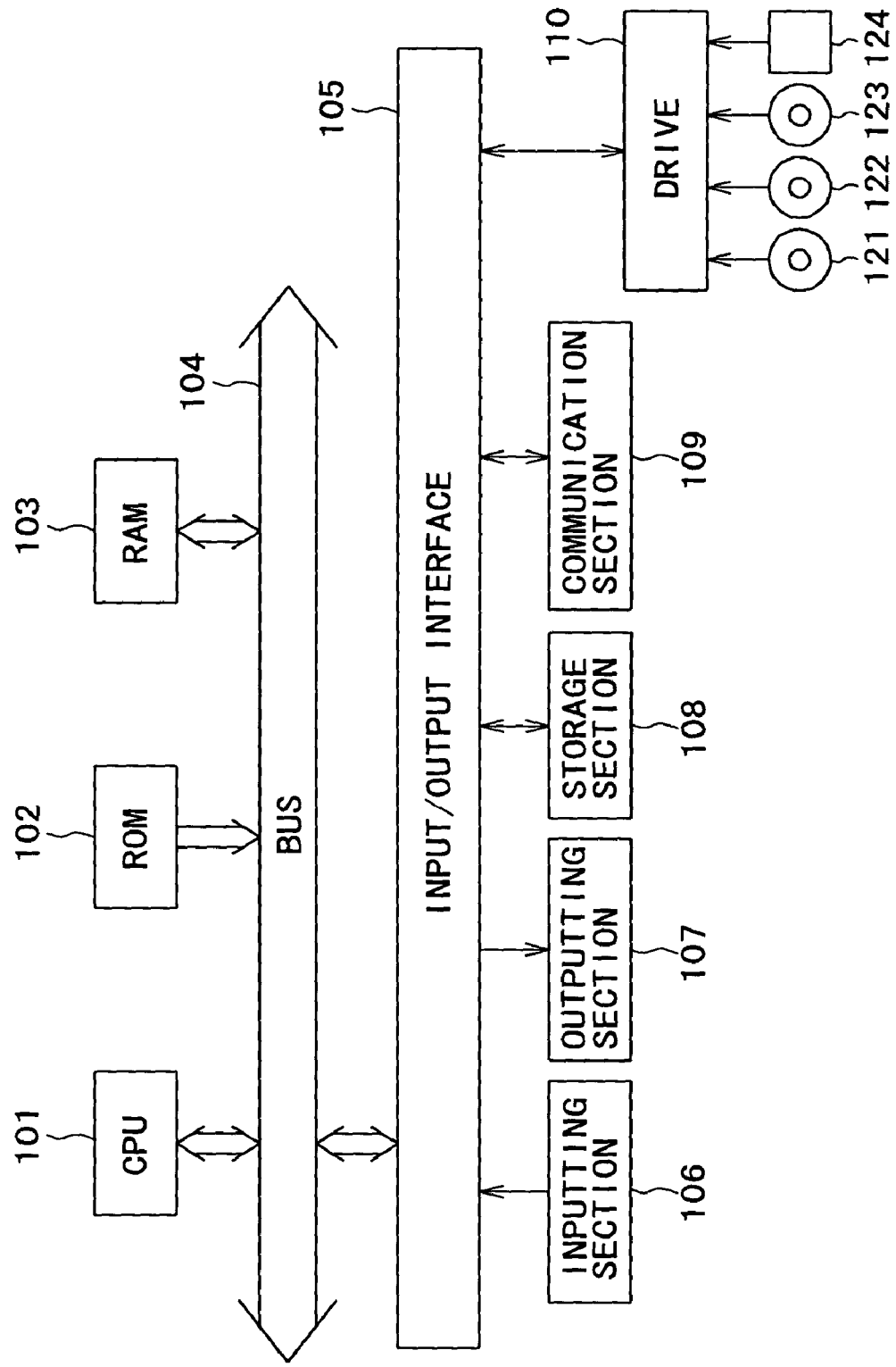

MAGNETIC TAPE RECORDING APPARATUS

TECHNICAL FIELD

This invention relates to a magnetic tape recording apparatus, and more particularly to a magnetic tape recording apparatus wherein, where a reproduction is performed at a variable speed in a long time mode for feeding a tape at a speed lower than that in a standard mode, data can be acquired with certainty and a good image can be displayed.

BACKGROUND ART

In recent years, a technique for compressing and recording image data and sound data has been advanced and practically applied. For example, the MPEG (Moving Picture Expert Group) method is used as a compression method of a high efficiency.

The applicant of the present application has formerly proposed a reproducing method in Japanese Patent Laid-open No. 2001-36412. For example, the method reproduces the recorded image data, at a variable speed including a twofold speed or more in the forward direction and a non-magnified speed or more in the reverse direction, from a recording medium in which image data interframe-compressed by a high efficiency coding method such as the MPEG2 are recorded by a helical scanning method, in the case that the track width of a magnetic head for recording and the width of a track to be recorded are equal to each other.

In the proposal, data for variable speed reproduction is discretely recorded at positions which are to be traced upon variable speed reproduction, and also the arrangement pattern wherein the data is recorded matches with the interleave. Consequently, data can be acquired with certainty upon variable speed reproduction, and matching between two kinds of regularity of image data for variable speed reproduction and the interleave can be established upon editing such as intermittent successive recording.

The above-mentioned proposal, however, has such problems as described below. In particular, if a magnetic tape is fed at a low speed when compared with a speed in a standard mode as in, for example, a long time mode to record data, then the crosstalk amount from a same azimuth track neighboring across one track increases and the number of sync blocks which can be acquired by one trace decreases, when compared with crosstalk amount and a number of sync blocks where a magnetic tape on which data is recorded in a standard mode is reproduced at a high variable speed. There is the possibility that a failure in acquisition of the data may occur, accordingly.

Further, the influence of a bend of a recording track arising from a recording apparatus or a reproduction apparatus, distortion of a trace upon reproduction, a displacement of the position of a recording track by jitters of velocity servo upon recording, a deviation of the feeding speed by jitters of position lock servo upon reproduction and so forth increases as the recording track width decreases with respect to the track width of the recording magnetic head. As a result, with a magnetic tape of a long time mode, an error of a trace with respect to a target position upon high speed reproduction occurs more significantly than with a magnetic tape of a standard mode, and there still is a subject that a failure in acquisition of the data may occur.

DISCLOSURE OF INVENTION

The present invention has been made taking such a situation as described above into consideration, and the object of the present invention is that, upon variable speed reproduction in a long time mode, data can be acquired with certainty and a good image can be displayed, when data for variable speed reproduction is recorded discretely at positions which should be traced upon variable speed reproduction. And, the object is accomplished by decreasing the number of sync blocks to be recorded in one area in one track with respect to the number of sync blocks which can be acquired by one trace per one track and by increasing the number of areas in each track, as the recording track width decreases with respect to the track width of a recording magnetic head.

A first magnetic tape recording apparatus of the present invention is characterized by comprising inputting means for inputting digital image data, extraction means for extracting digital image data for variable speed reproduction from the digital image data inputted by the inputting means, production means for producing, from the digital image data extracted by the extraction means, digital image recording data for variable speed reproduction to be recorded into a predetermined area of a first region positioned substantially at the center of the track or predetermined areas of both of the first region and a second region positioned at a position which is traced upon variable speed reproduction in a track positioned in the neighborhood of the track, and recording means for recording the digital image recording data for variable speed reproduction produced by the production means into the first and second regions such that the number of unit blocks in one area when the digital image recording data for variable speed reproduction is recorded in the long time mode is smaller than the number of unit blocks when the digital image recording data for variable speed reproduction is recorded in the standard mode.

A first magnetic tape recording method of the present invention is characterized by comprising an inputting step of inputting the digital image data, an extraction step of extracting digital image data for variable speed reproduction from the digital image data inputted by the process at the inputting step, a production step of producing, from the digital image data extracted by the process at the extraction step, digital image recording data for variable speed reproduction to be recorded into a predetermined area of a first region positioned substantially at the center of the track or predetermined areas of both of the first region and a second region positioned at a position which is traced upon variable speed reproduction in a track positioned in the neighborhood of the track, and a recording step of recording the digital image recording data for variable speed reproduction produced by the process at the production step into the first and second regions such that the number of unit blocks in one area when the digital image recording data for variable speed reproduction is recorded in the long time mode is smaller than the number of unit blocks in one area when the digital image recording data for variable speed reproduction is recorded in the standard mode.

A first recording medium of the present invention is characterized in that a program comprises an inputting control step of controlling inputting of digital image data, an extraction step of extracting digital image data for variable speed reproduction from the digital image data whose inputting is controlled by the process at the inputting control step, a production step of producing, from the digital image data extracted by the process at the extraction step, digital image recording data for variable speed reproduction to be recorded into a predetermined area of a first region positioned substantially at the center of the track or predetermined areas of both of the first region and a second region positioned at a position which is traced upon variable speed reproduction in a track positioned in the neighborhood of the track, and a recording step of recording the digital image recording data for variable speed reproduction produced by the process at the production step into the first and second regions such that the number of unit blocks in one area when the digital image recording data for variable speed reproduction is recorded in the long time mode is smaller than the number of unit blocks in one area when the digital image recording data for variable speed reproduction is recorded in the standard mode.

A first program of the present invention is characterized by comprising an inputting control step of controlling inputting of digital image data, an extraction step of extracting digital image data for variable speed reproduction from the digital image data whose inputting is controlled by the process at the inputting control step, a production step of producing, from the digital image data extracted by the process at the extraction step, digital image recording data for variable speed reproduction to be recorded into a predetermined area of a first region positioned substantially at the center of the track or predetermined areas of both of the first region and a second region positioned at a position which is traced upon variable speed reproduction in a track positioned in the neighborhood of the track, and a recording step of recording the digital image recording data for variable speed reproduction produced by the process at the production step into the first and second regions such that the number of unit blocks in one area when the digital image recording data for variable speed reproduction is recorded in the long time mode is smaller than the number of unit blocks in one area when the digital image recording data for variable speed reproduction is recorded in the standard mode.

A first magnetic tape of the present invention is characterized in that digital image recording data for variable speed reproduction is recorded in a predetermined area of a first region positioned substantially at the center of a track or predetermined areas of both of the first region and a second region positioned at a position which is traced upon variable speed reproduction in a track positioned in the neighborhood of the track such that the number of unit blocks in one area when the digital image recording data for variable speed reproduction is recorded in the long time mode is smaller than the number of unit blocks in one area when the digital image recording data for variable speed reproduction is recorded in the standard mode.

A second magnetic tape recording apparatus of the present invention is characterized by comprising inputting means for inputting digital image data, extraction means for extracting digital image data for variable speed reproduction from the digital image data inputted by the inputting means, production means for producing, from the digital image data extracted by the extraction means, digital image recording data for variable speed reproduction to be recorded into a predetermined area of a first region positioned substantially at the center of the track or predetermined areas of both of the first region and a second region positioned at a position which is traced upon variable speed reproduction in a track positioned in the neighborhood of the track, and recording means for recording the digital image recording data for variable speed reproduction produced by the production means into the areas of the first and second regions such that the number of areas in the tracks when the digital image recording data for variable speed reproduction is recorded in the long time mode is greater than the number of areas in the tracks when the digital image recording data for variable speed reproduction is recorded in the standard mode.

A second magnetic tape recording method of the present invention is characterized by comprising an inputting step of inputting digital image data, an extraction step of extracting digital image data for variable speed reproduction from the digital image data inputted by the process at the inputting step, a production step of producing, from the digital image data extracted by the process at the extraction step, digital image recording data for variable speed reproduction to be recorded into a predetermined area of a first region positioned substantially at the center of the track or predetermined areas of both of the first region and a second region positioned at a position which is traced upon variable speed reproduction in a track positioned in the neighborhood of the track, and a recording step of recording the digital image recording data for variable speed reproduction produced by the process at the production step into the areas of the first and second regions such that the number of areas in the tracks when the digital image recording data for variable speed reproduction is recorded in the long time mode is greater than the number of areas in the tracks when the digital image recording data for variable speed reproduction is recorded in the standard mode.

A second recording medium of the present invention is characterized in that a program comprises an inputting control step of controlling inputting of digital image data, an extraction step of extracting digital image data for variable speed reproduction from the digital image data whose inputting is controlled by the process at the inputting control step, a production step of producing, from the digital image data extracted by the process at the extraction step, digital image recording data for variable speed reproduction to be recorded into a predetermined area of a first region positioned substantially at the center of the track or predetermined areas of both of the first region and a second region positioned at a position which is traced upon variable speed reproduction in a track positioned in the neighborhood of the track, and a recording step of recording the digital image recording data for variable speed reproduction produced by the process at the production step into the areas of the first and second regions such that the number of areas in the tracks when the digital image recording data for variable speed reproduction is recorded in the long time mode is greater than the number of areas in the tracks when the digital image recording data for variable speed reproduction is recorded in the standard mode.

A second program of the present invention is characterized by comprising an inputting control step of controlling inputting of digital image data, an extraction step of extracting digital image data for variable speed reproduction from the digital image data whose inputting is controlled by the process at the inputting control step, a production step of producing, from the digital image data extracted by the process at the extraction step, digital image recording data for variable speed reproduction to be recorded into a predetermined area of a first region positioned substantially at the center of the track or predetermined areas of both of the first region and a second region positioned at a position which is traced upon variable speed reproduction in a track positioned in the neighborhood of the track, and a recording step of recording the digital image recording data for variable speed reproduction produced by the process at the production step into the areas of the first and second regions such that the number of areas in the tracks when the digital image recording data for variable speed reproduction is recorded in the long time mode is greater than the number of areas in the tracks when the digital image recording data for variable speed reproduction is recorded in the standard mode.

A second magnetic tape of the present invention is characterized in that digital image recording data for variable speed reproduction is recorded in a predetermined area of a first region positioned substantially at the center of a track or predetermined areas of both of the first region and a second region positioned at a position which is traced upon variable speed reproduction in a track positioned in the neighborhood of the track such that the number of areas in the tracks when the digital image recording data for variable speed reproduction is recorded in the long time mode is greater than the number of areas in the tracks when the digital image recording data for variable speed reproduction is recorded in the standard mode.

The digital image data recorded in the first region may be digital image data which is reproduced commonly in variable speed reproduction in the forward direction and variable speed reproduction in the reverse direction.

The recording means may determine a predetermined number of tracks as one period and record the digital image data into the first and second regions in accordance with a predetermined pattern for each period.

The recording means may record the digital image data onto a magnetic tape by means of the rotary head which has an azimuth discriminated to have a direction of recording magnetization close to the direction of arrangement of a magnetic material of the magnetic tape.

The recording means may record, when the digital image data is to be recorded onto tracks having the opposite azimuths to each other, digital image data for a higher multiplied speed onto one of the tracks which has an azimuth of a direction of a recording magnetic field nearer to the direction of arrangement of the magnetic material of the magnetic tape and record digital image data for a lower multiplied speed onto the other track.

The recording means may produce digital image data for an n multiplied speed and arrange and record the digital image data at n or 2n track intervals and substantially at the center of each of the tracks, n being an exponentiation of 2. And, the arranged digital image data is used for variable speed reproduction in the forward direction and the reverse direction at an m multiplied speed which is an exponentiation of 2 and for non-multiplied speed reproduction in the reverse direction.

The values n and m may be set so as to satisfy a relationship of m<n.

The recording means may record the digital image data, which is to be recorded in the first and second regions respectively, a plural number of times in each of the first and second regions.

In the first magnetic tape recording apparatus, magnetic tape recording method, recording medium, program and magnetic tape of the present invention, digital image data is recorded into a predetermined area of a first region positioned substantially at the center of the track or predetermined areas of both of the first region and a second region positioned at a position which is traced upon variable speed reproduction in a track positioned in the neighborhood of the track such that the number of unit blocks in one area when the digital image data for variable speed reproduction is recorded in the long time mode is smaller than the number of unit blocks in one area when the digital image data for variable speed reproduction is recorded in the standard mode.

In the second magnetic tape recording apparatus, magnetic tape recording method, recording medium, program and magnetic tape of the present invention, digital image data is recorded into a predetermined area of a first region positioned substantially at the center of the track or predetermined areas of both of the first region and a second region positioned at a position which is traced upon variable speed reproduction in a track positioned in the neighborhood of the track such that the number of areas in the tracks is greater than that when the digital image data for variable speed reproduction is recorded in the standard mode.

BRIEF DESCRIPTION OF DRAWINGS

FIG. 20 is a view showing an example of a data arrangement pattern taking the interleave in the standard mode into consideration;

FIG. 21 is a view illustrating a relationship between an envelope of an RF signal and reproduction data when the track is narrow;

FIG. 25 is a view showing an example of a data arrangement pattern of data for sixteenfold speed reproduction in the long time mode;

FIG. 26 is a view showing an example of a data arrangement pattern of data for twenty-fourfold speed reproduction in the long time mode;

FIG. 27 is a view showing an example of a data arrangement pattern of data for thirty-twofold speed reproduction in the long time mode;

FIG. 28 is a view showing an example of a data arrangement pattern with the interleave in the long time mode taken into consideration; and FIG. 29 is a view illustrating media.

BEST MODE FOR CARRYING OUT THE INVENTION

Figure 1:
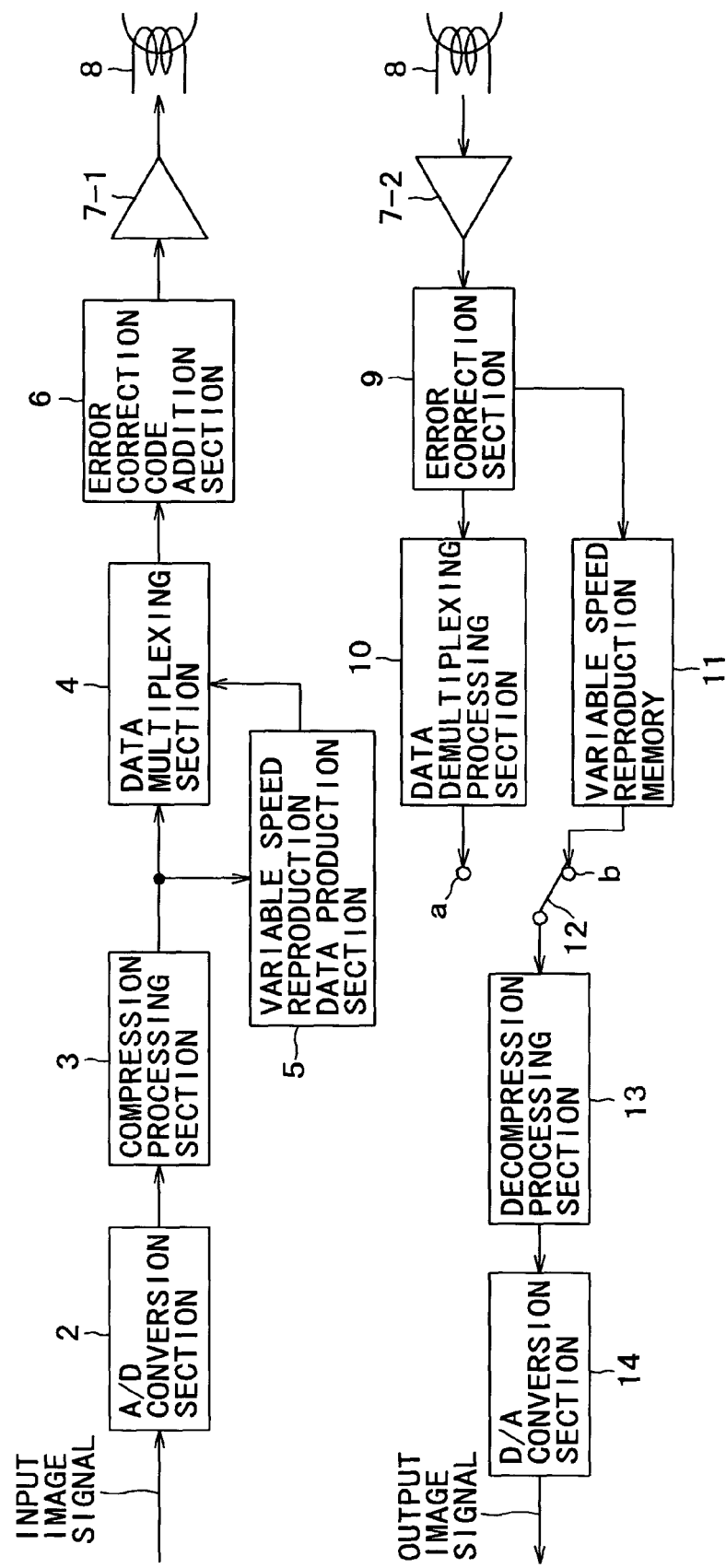
FIG. 1 is a block diagram showing a configuration of an embodiment of a recording and reproduction apparatus to which the present invention is applied.

In the following, an embodiment of the present invention is described with reference to the drawings. FIG. 1 is a view showing a configuration of an embodiment of a recording and reproduction apparatus to which the present invention is applied. An image signal outputted from a video camera or the like (not shown) is inputted to an A/D (Analog/Digital) conversion section 2 of a recording and reproduction apparatus 1. The analog image signal inputted to the A/D conversion section 2 is converted into digital image data and outputted to a compression processing section 3. The compression processing section 3 performs a compression process for the inputted image data in accordance with a predetermined method and outputs the resulting data to a data multiplexing section 4 and a variable speed reproduction data production section 5.

Where the MPEG method is used for the compression process to be performed by the compression processing section 3, the compression processing section 3 performs DCT (Discrete Cosine Transform) conversion for the inputted image data and performs a coding process in accordance with the MPEG2 method for it, and outputs the compressed image data to the data multiplexing section 4. The coding process by the MPEG2 method is further described with reference to FIG. 2. In an image signal, for example, fifteen frames are determined as a GOP (Group of Picture) as a unit of the compression process, and each frame of the image signal is converted into one of three pictures called I picture, B picture and P picture.

The I picture is image data produced by intraframe compression. The P picture is image data produced not only by intraframe compression but also by compression using information of a preceding frame. The B picture is image data produced not only by intraframe compression but also by compression using information of preceding and succeeding frames.

Figure 2:
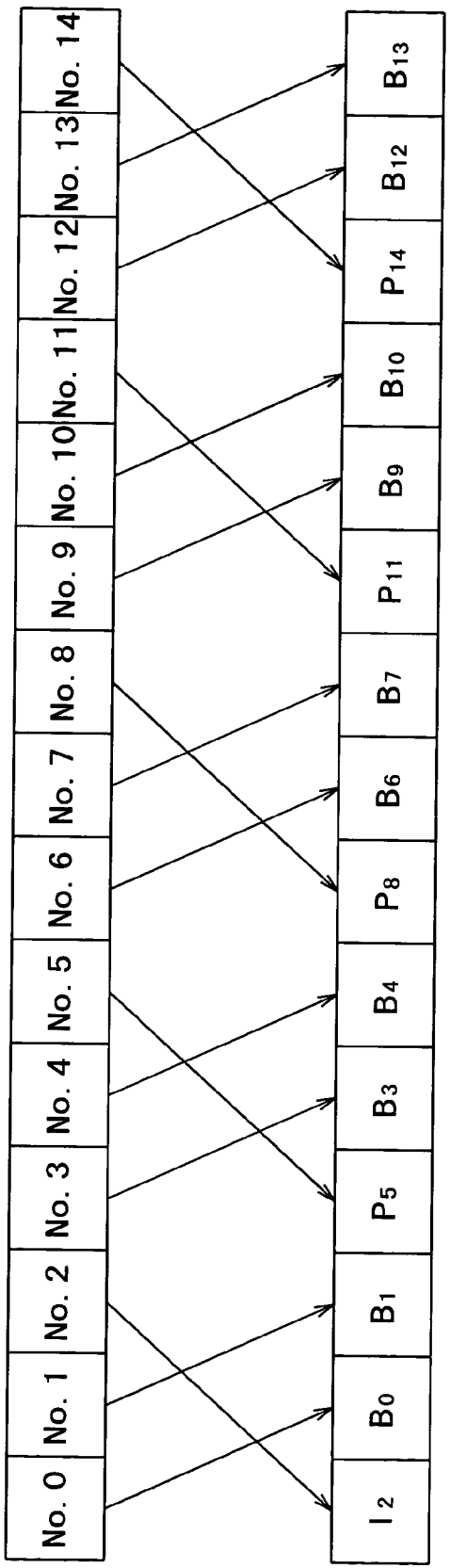
FIG. 2 is a view illustrating compression.

A data stream formed from I pictures, P pictures and B pictures produced in this manner and arranged in such an order as shown, for example, at a lower stage of FIG. 2 is inputted to the data multiplexing section 4 and multiplexed with some other data (for example, sound data, system data such as sub codes and so forth), and then outputted to an error correction code addition section 6. Also image data for variable speed reproduction produced by the variable speed reproduction data production section 5 is included in the data to be multiplexed by the data multiplexing section 4.

The variable speed reproduction data production section 5 produces image data for only variable speed reproduction using only an I picture from within the image data outputted from the compression processing section 3. Details of the process just described are hereinafter described with reference to a flow chart of FIG. 6. While, as described above, the I picture is compressed using only intraframe data, P pictures and B pictures are compressed using not only intraframe data but also information of other frames (pictures). This signifies that the P pictures and B pictures can be decoded only when information of such other pictures is read out. Since an I picture can be decoded without depending upon a readout situation of any other picture, the I picture is suitable as data to be read out in such a situation that only part of image data can be read out like upon variable speed reproduction.

An error correction code is further added to the multiplexed data inputted to the error correction code addition section 6, and the resulting data is supplied to a rotary head 8 through an amplifier 7-1. The rotary head 8 records the supplied data onto a magnetic tape as a recording medium not shown.

On the other hand, data including image data recorded on a recording medium is reproduced by the rotary head 8 and is supplied to an error correction section 9 through an amplifier 7-2. The error correction section 9 performs an error correction process for the supplied data and outputs resulting data to a data demultiplexing processing section 10 and a variable speed reproduction memory 11. The data demultiplexing processing section 10 performs a process opposite to that of the data multiplexing section 4. In particular, the data demultiplexing processing section 10 demultiplexes the inputted multiplexed data into data such as image data, sound data and system data.

The image data from within the demultiplexed data is outputted to a decompression processing section 13 through a switch 12. The switch 12 connected to the decompression processing section 13 is connected, upon normal reproduction (forward direction non-magnified speed reproduction), to the terminal "a" side so that the image data from the data demultiplexing processing section 10 can be supplied to the decompression processing section 13, but is connected, upon any other reproduction (variable speed reproduction), to the terminal "b" side so that data stored in the variable speed reproduction memory 11 can be supplied to the decompression processing section 13.

Image data for variable speed reproduction produced by the variable speed reproduction data production section 5 is stored into the variable speed reproduction memory 11. Since, upon variable speed reproduction, data is intermittently inputted to the error correction section 9, only error correction for an inner code is performed, and image data wherein error correction is performed only for the inner code is temporarily stored into the variable speed reproduction memory 11. As a readout method of the image data from the variable speed reproduction memory 11, a method wherein it is performed in a fixed cycle synchronized with frames of a reproduction image and another method wherein it is performed when image data for one frame is stored is available, and either one of the methods may be used.

The decompression processing section 13 performs a decompression process (process such as decoding, inverse DCT conversion and so forth by the MPEG method) for the image data inputted through the switch 12 and outputs the resulting data to a television receiver (not shown) or the like as a displaying device through a D/A conversion section 14.

Figure 3:
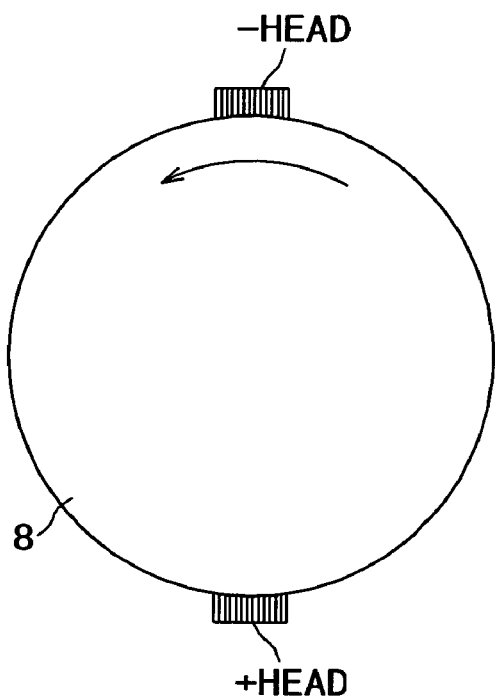
FIG. 3 is a view showing a rotary head.
Figure 4:
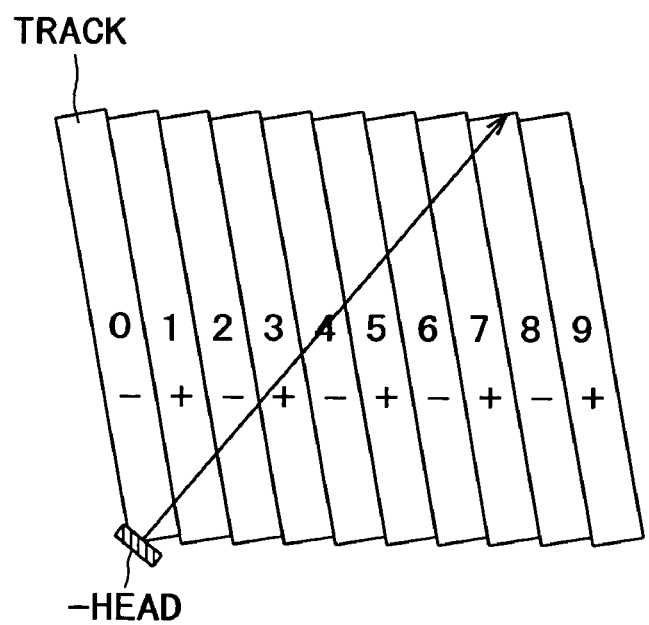
FIG. 4 is a view illustrating a recording pattern.

The recording and reproduction apparatus 1 including the rotary head 8 having such a configuration as shown in FIG. 3 is examined here. The rotary head 8 shown in FIG. 3 includes two heads having azimuth angles different from each other. One of the heads is specified as "+ (plus)" head, and the other head is specified as "− (minus)" head. A recording pattern on a magnetic tape as a recording medium to be recorded by such a rotary head as described above is formed as shown in FIG. 4. In particular, tracks are formed alternately by the "−" and "+" heads such that a track 0 is formed by the "−" head, a track 1 is formed by the "+" head, and further a track 2 is formed by the "−" head.

Figure 5:
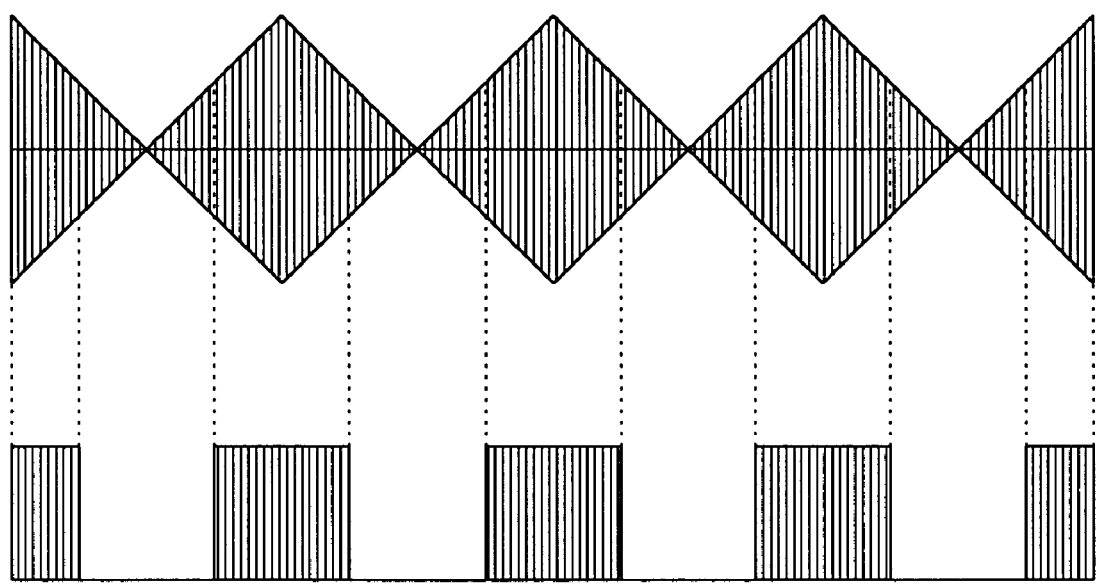
FIG. 5 is a view illustrating a relationship between an envelope of an RF signal and reproduction data.

For example, where ninefold speed reproduction is performed, the "−" head traces nine tracks (in the example of FIG. 4, tracks 0 to 8) by one trace so that data of a predetermined portion is read out from the nine tracks. The upper stage of FIG. 5 shows envelopes of an RF signal when ninefold speed reproduction is performed while the lower stage of FIG. 5 illustrates reproduction data to be demodulated when, for example, data whose output level ranges from a peak level to a level lower by 6 dB than the peak level are demodulated. As shown at the lower stage of FIG. 5, it can be seen that reproduction data upon variable speed reproduction makes an intermittent data string.

Thus, if the running speed of the tape as a recording medium and the phase of the head trace with respect to the tape pattern are kept fixed, then data arranged at the central position of the tape can be traced with certainty.

However, since increase of the speed magnification number decreases the magnitude of one lump envelopes of an RF signal described hereinabove with reference to FIG. 5, the amount of data included in the lump decreases.

Accordingly, if the speed magnification number becomes large, then a sufficient amount of data cannot be recorded only with the data disposed at the center. Thus, in the present invention, where the speed magnification number is great, one piece of data is recorded discretely in a plurality of regions. The process in this instance is described with reference to a flow chart of FIG. 6.

Figure 6:
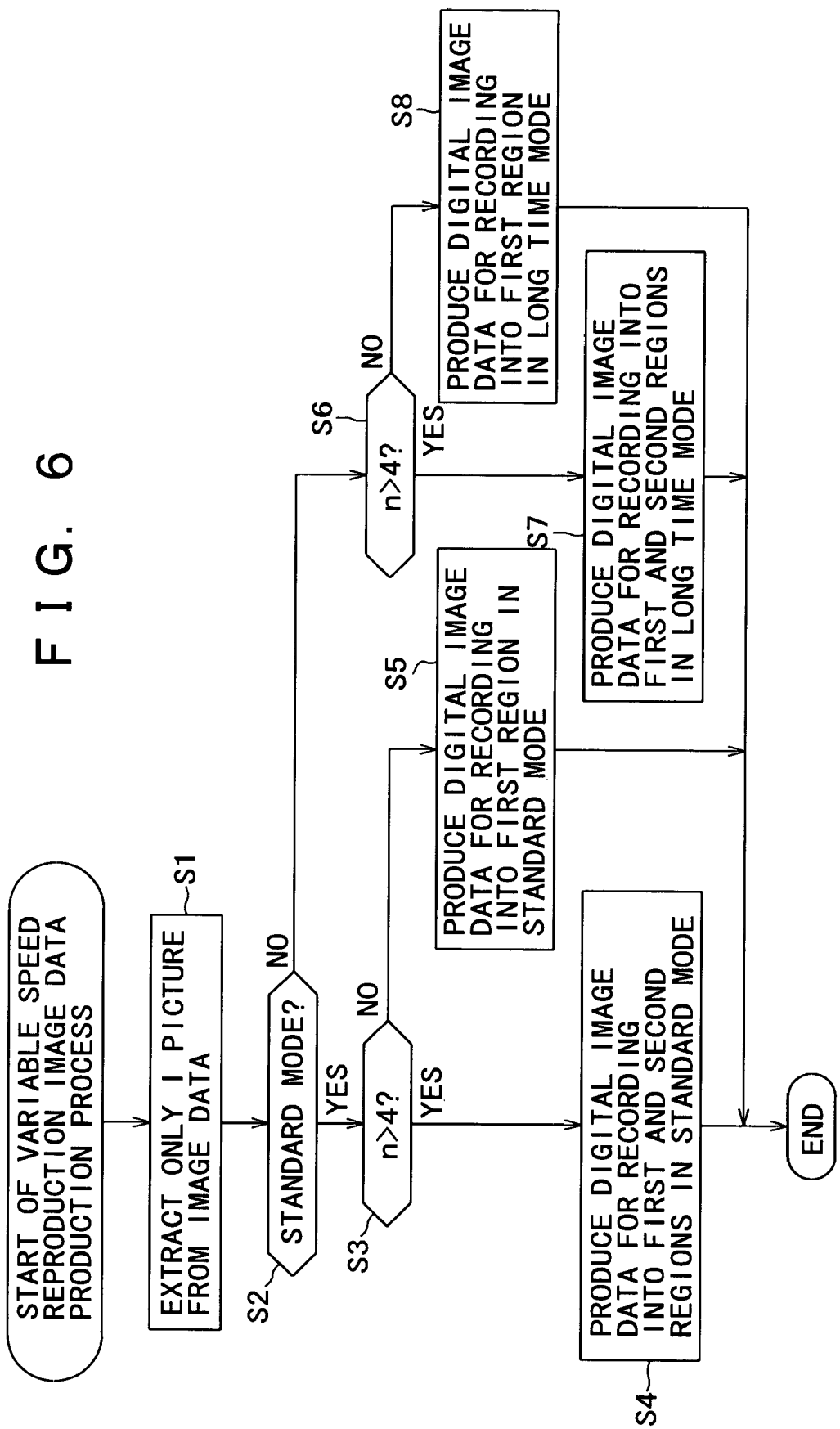
FIG. 6 is a flow chart illustrating a production process of image data for variable speed reproduction.

The process of the flow chart of FIG. 6 is executed by the variable speed reproduction data production section 5 of the recording and reproduction apparatus 1 of FIG. 1. First at step S1, the variable speed reproduction data production section 5 extracts only an I picture from compressed image data supplied from the compression processing section 3. Then at step S2, the variable speed reproduction data production section 5 discriminates whether or not the recording mode is the standard mode.

If the recording mode is the standard mode, then the variable speed reproduction data production section 5 discriminates the speed magnification number n at step S3. If n>4, that is, if the speed magnification number n is great, then the variable speed reproduction data production section 5 produces digital image data for first region recording and digital image data for second region recording (hereinafter described with reference to FIG. 7) at step S4. On the other hand, if the speed magnification number n is not n>4, for example, if the speed magnification number n is for fourfold speed reproduction, then the variable speed reproduction data production section 5 produces only digital image data for first region recording at step S5.

Further, if it is discriminated at step S2 that the recording mode is not the standard mode (that is, the recording mode is the long time mode), then the variable speed reproduction data production section 5 discriminates the speed magnification number n at step S6. If n>4, that is, if the speed magnification number n is great, then the variable speed reproduction data production section 5 produces digital image data for first region recording and digital image data for second region recording at step S7. On the other hand, if the speed magnification number n is not n>4, that is, if the speed magnification number n is for fourfold speed reproduction, then the variable speed reproduction data production section 5 produces only digital image data for first region recording at step S8.

Figure 7:
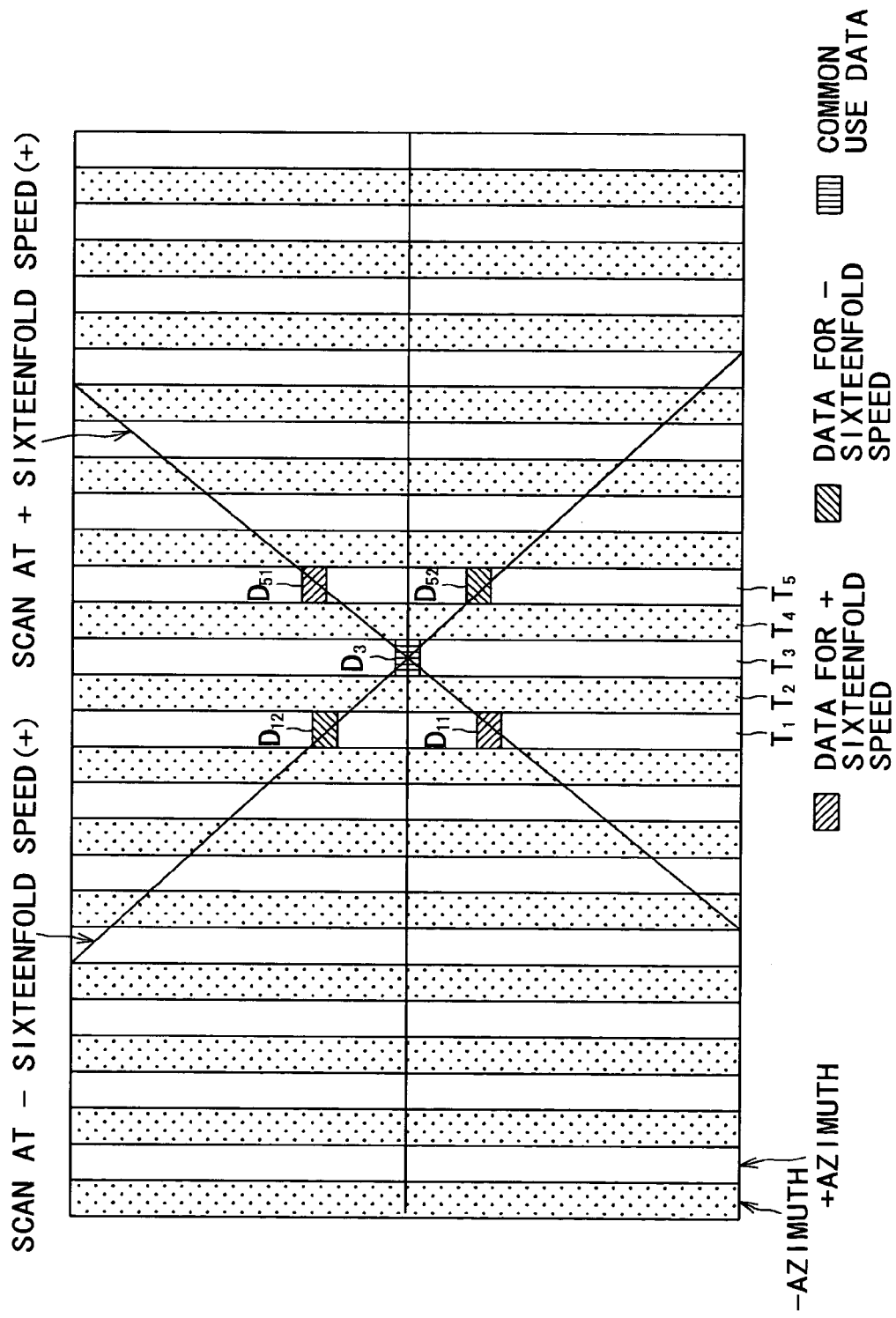
FIG. 7 is a view showing an example of a data arrangement pattern of data for sixteenfold speed reproduction.

FIG. 7 illustrates an arrangement of image data for variable speed reproduction at the sixteenfold speed (such data is hereinafter referred to also simply as data for sixteenfold speed reproduction) by the process at step S4, that is, when the speed magnification number n in the standard mode is 16. In the present example, since n>4, when the "+" head traces a magnetic tape at the "+" sixteenfold or "−" sixteenfold speed, a first region is formed on a track T3 on which the "+" head passes the center of the magnetic tape in the widthwise direction and digital image data D3 for first region recording is disposed into the first region.

A second region is formed at a position, which is passed by the "+" head, of each of a track T1 (a track neighboring with the track T3 across a track T2) and a track T5 (a track neighboring with the track T3 across a track T4) of the same azimuth (in the example of FIG. 7, a "+" azimuth) on the opposite sides of the track T3 neighboring therewith across one track, and digital image data D11, D12 and D51, D52 for second region recording are arranged in the second regions.

It is to be noted that the digital image data D3 for first region recording arranged in the first region of the track T3 is data for common use for the "+" sixteenfold speed and the "−" sixteenfold speed. In contrast, the digital image data D11 and D51 for second region recording are data for the "+" sixteenfold speed, and the digital image data D12 and D52 for second region recording are data for the "−" sixteenfold speed.

Figure 8:
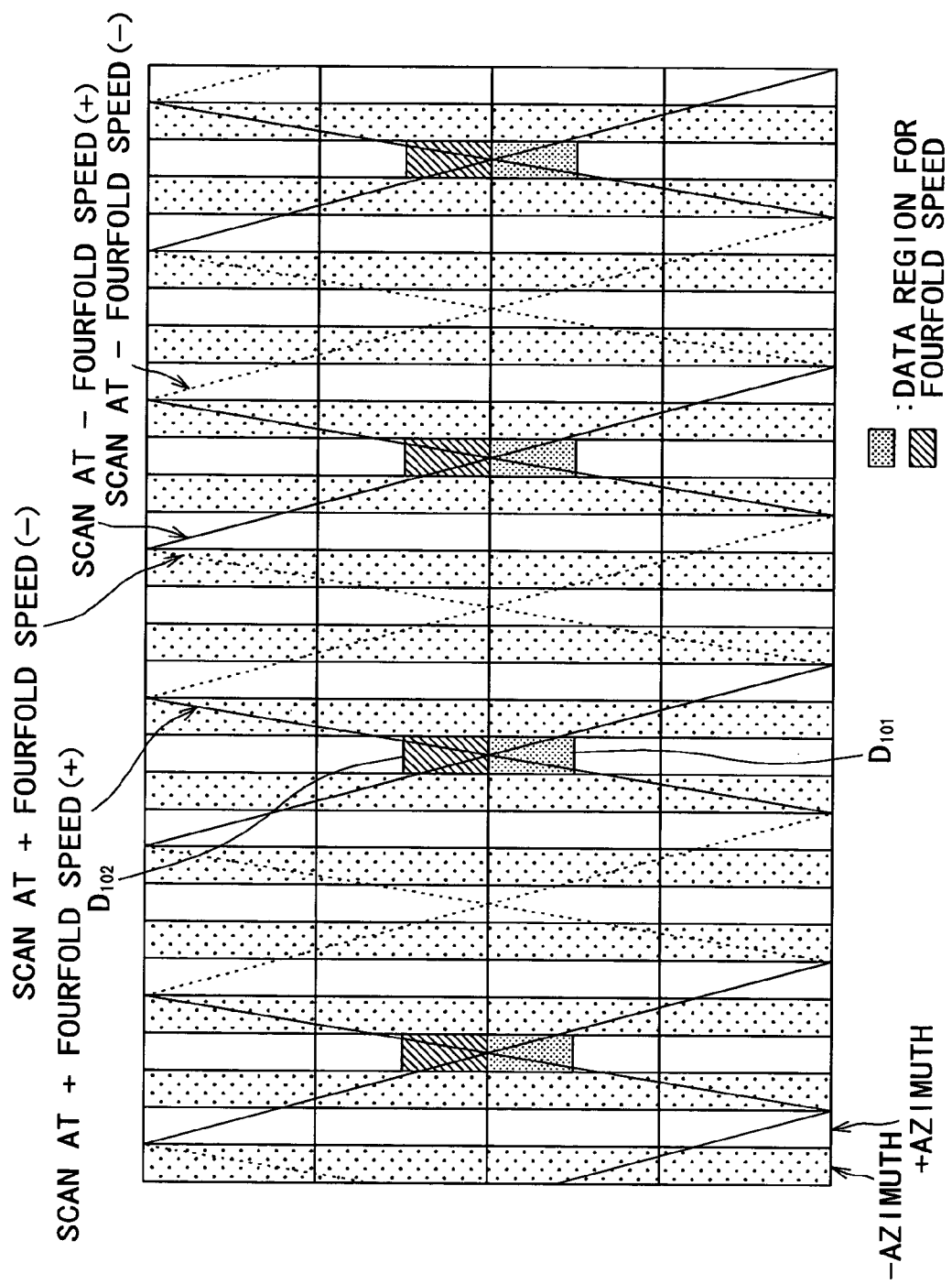
FIG. 8 is a view showing another example of a data arrangement pattern of data for fourfold speed reproduction.

It is to be noted that, as image data for variable speed reproduction (image data for variable speed reproduction produced by the process at step S5) upon magnified speed reproduction at a speed equal to or lower than the fourfold speed (for example, upon fourfold speed reproduction illustrated in FIG. 8), only the digital image data D3 for first region recording is recorded, but the digital image data D11, D12 and D51, D52 for second region recording are not recorded.

However, such a case may possibly occur that, from such factors as a bend of a recording track arising from the recording and reproduction apparatus 1, distortion of the trace upon reproduction, position displacement of a recording track by jitters of velocity servo upon recording, a deviation of the running speed by jitters of phase locked servo upon reproduction and so forth, an error of the trace with respect to the position of a target trace occurs, resulting in failure to acquire data for variable speed reproduction provided in such a data arrangement as described above.

In the present invention, in order to prevent this, same data for variable speed reproduction of each track to be traced by one trace is recorded repetitively by a plural number of times in the proximity of a reference position (position traced when such an error of a trace as is caused by such factors as described above does not occur).

As shown in FIG. 8, as to data for fourfold speed reproduction, same data is repetitively recorded twice as data D101 and D102.

Generally, when recording onto a track on a recording medium such as a magnetic tape is performed by a trace of a rotary head, data is recorded in a unit of a sync block.

Figure 9:
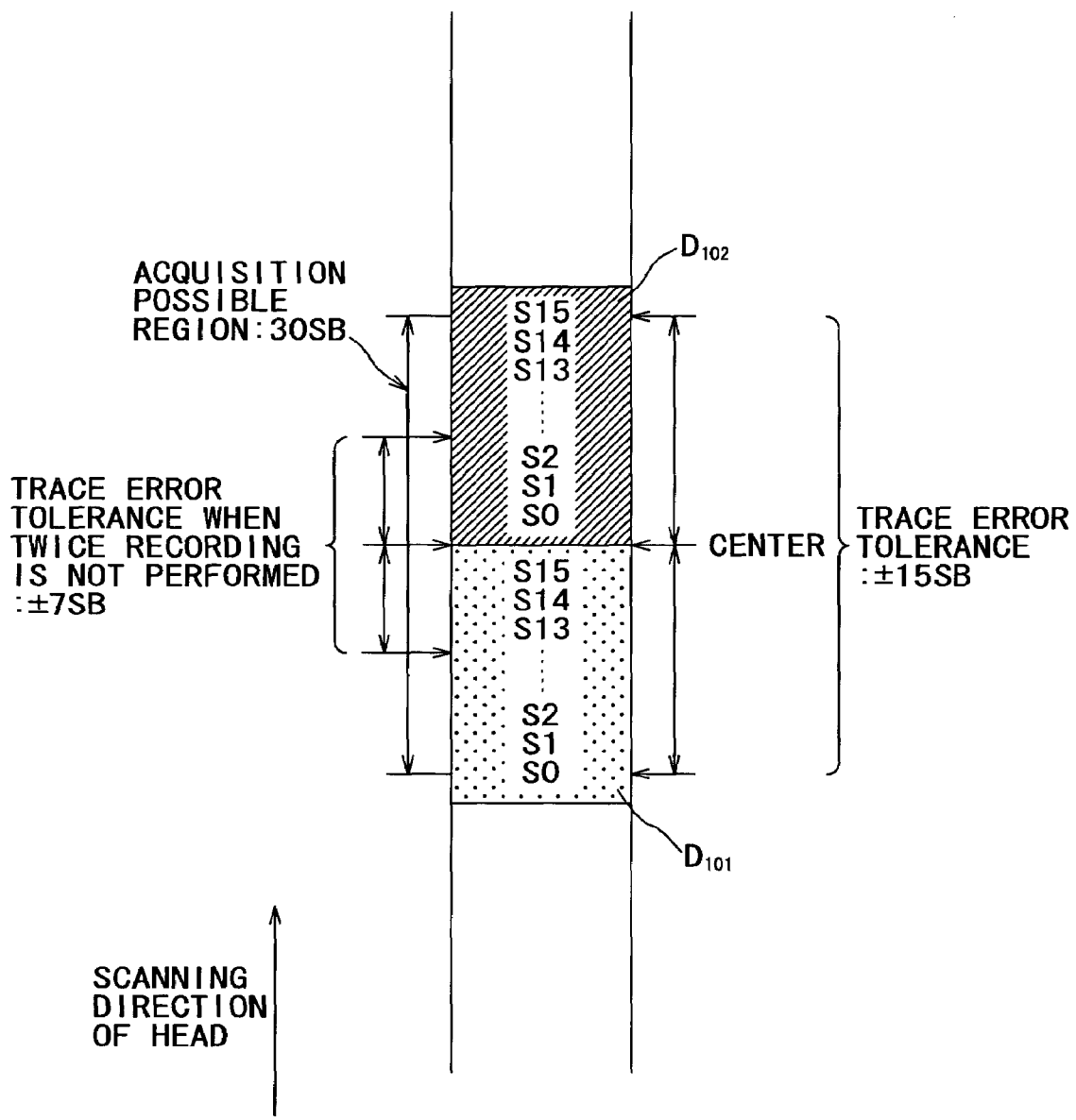
FIG. 9 is a view illustrating details of the data arrangement pattern shown in FIG. 8.

FIG. 9 is a view showing, in an enlarged scale, a data arrangement where data for fourfold speed reproduction is recorded twice repetitively. In the figure, SB denotes an abbreviation of a sync block. In the present example, sync blocks S0 to S15 are repetitively recorded twice as data D101 and D102 in the longitudinal direction such that they are centered at the center of the track. Where data is not repetitively recorded twice, or in other words, where data is recorded only once in a central region of the track, the range permitted as an error in a trace is ±7 SBs (sync blocks).

Upon fourfold speed reproduction, data of 30 SBs can be acquired from one track. However, in the example of FIG. 9, data which must be acquired by one trace is data of 16 sync blocks from S0 to S15. Accordingly, where the data is repetitively recorded twice as illustrated in FIG. 9, the range permitted as an error of a trace increases to ±15 SBs.

Figure 10:
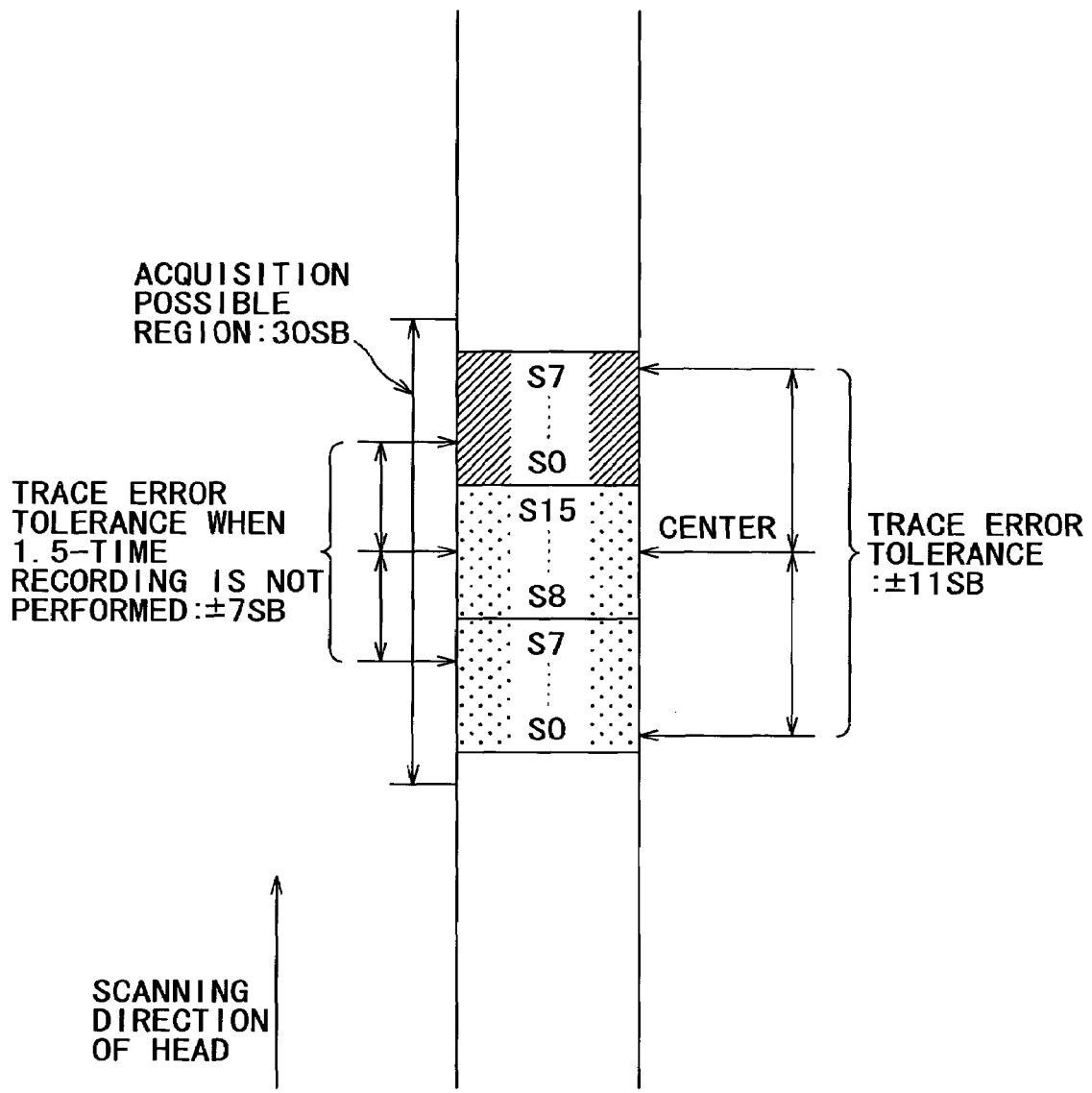
FIG. 10 is a view illustrating details of the data arrangement pattern shown in FIG. 8.

The number of times by which same data is recorded repetitively is not limited to twice as described above but may be any number of times. Further, the number of times need not be an integral number of times. An example of a data arrangement where the number of times of repetition is set to 1.5 times is shown in FIG. 10. That same data is recorded repetitively by 1.5 times signifies that one half of the data is recorded once and the other half of the data is repetitively recorded twice. In other words, in the example shown in FIG. 10, the sync blocks S0 to S7 are repetitively recorded twice and the sync blocks S8 to S15 are recorded only once.

Where same data is repetitively recorded by 1.5 times, the error tolerance of a trace is ±11 SBs. Also in this instance, the tolerance of an error of a trace is expanded when compared with the tolerance of an error of a trace where data is recorded only once.

Figure 11:
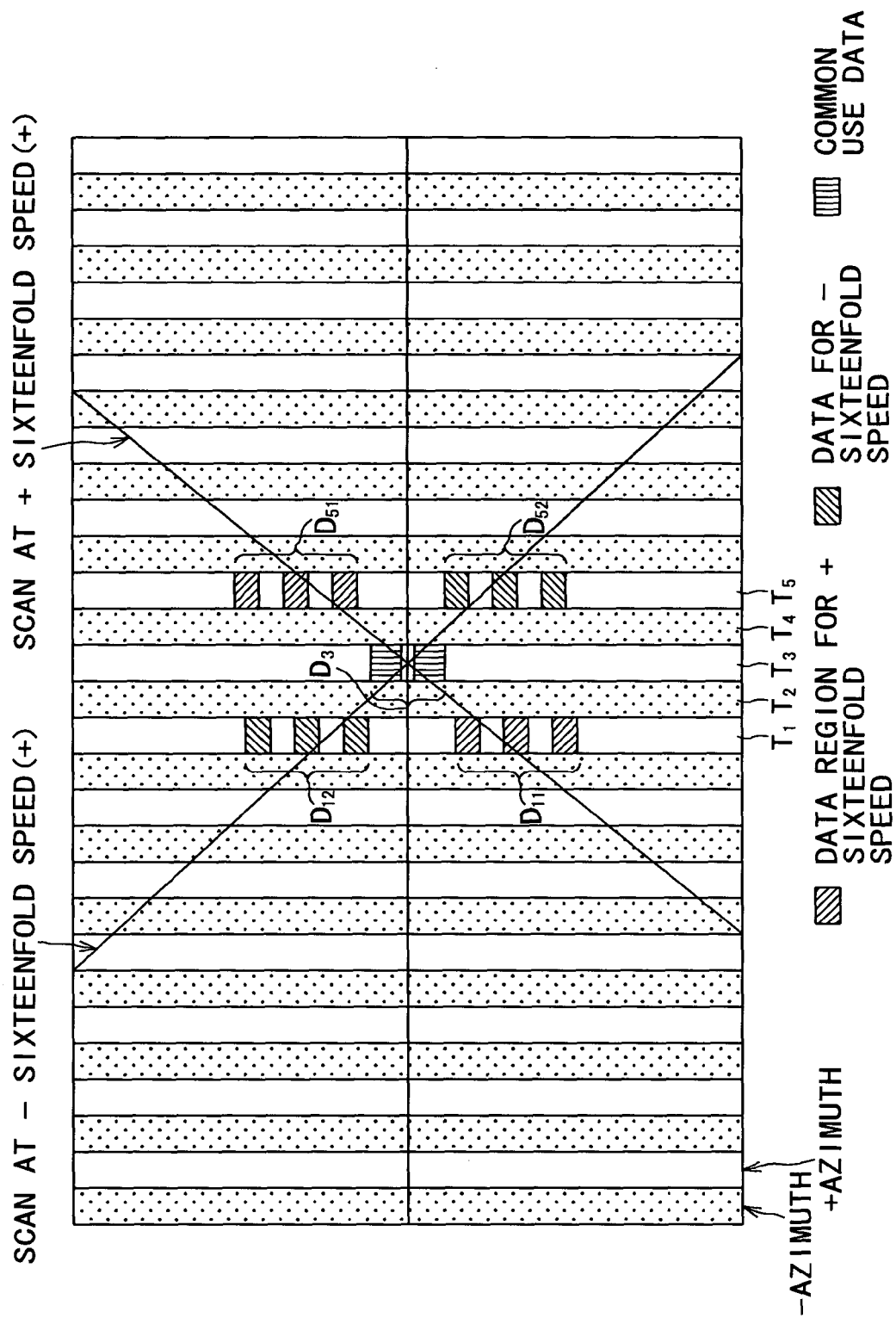
FIG. 11 is a view showing a further example of the data arrangement pattern of data for sixteenfold speed reproduction.
Figure 12:
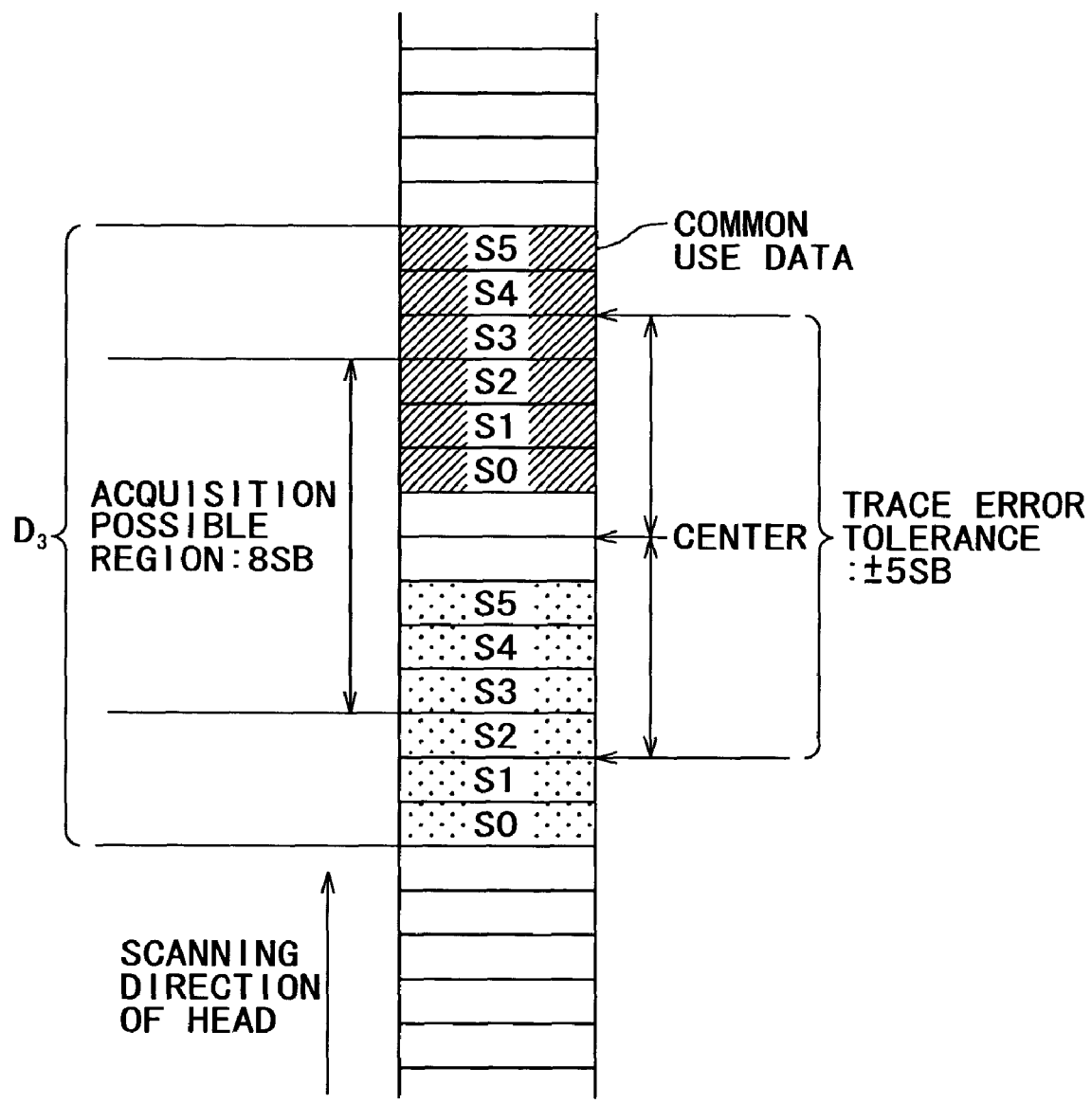
FIG. 12 is a view illustrating details of the data arrangement pattern shown in FIG. 11.

FIG. 11 illustrates a data arrangement where the image data D11, D12, D3, D51 and D52 shown in FIG. 7 are recorded repetitively by a plural number of times in the respective tracks. The data arrangement for sixteenfold speed reproduction shown in FIG. 11 is further described with reference to FIGS. 12 to 14. FIG. 12 is a view illustrating details of the data D3 in the region which is positioned on the track T3 and in which same data (sync blocks S0 to S5) is repetitively recorded twice (the region in which common use data is recorded) from within the data arrangement illustrated in FIG. 11. While the common use data is repetitively recorded twice, the two pieces of data are spaced by a distance corresponding to 2 SBs. Further, while a necessary amount of data is assured by one trace, the number of times of repetition is suppressed to twice so that the amount of data for variable speed reproduction is decreased, and this contributes to increase of the recording capacity of main data (usually for non-magnified speed reproduction). This arises from the fact that it is necessary only to take into consideration the minimum error arising from servo jitters or the like because the central region is a target position of phase locked servo.

Figure 13:
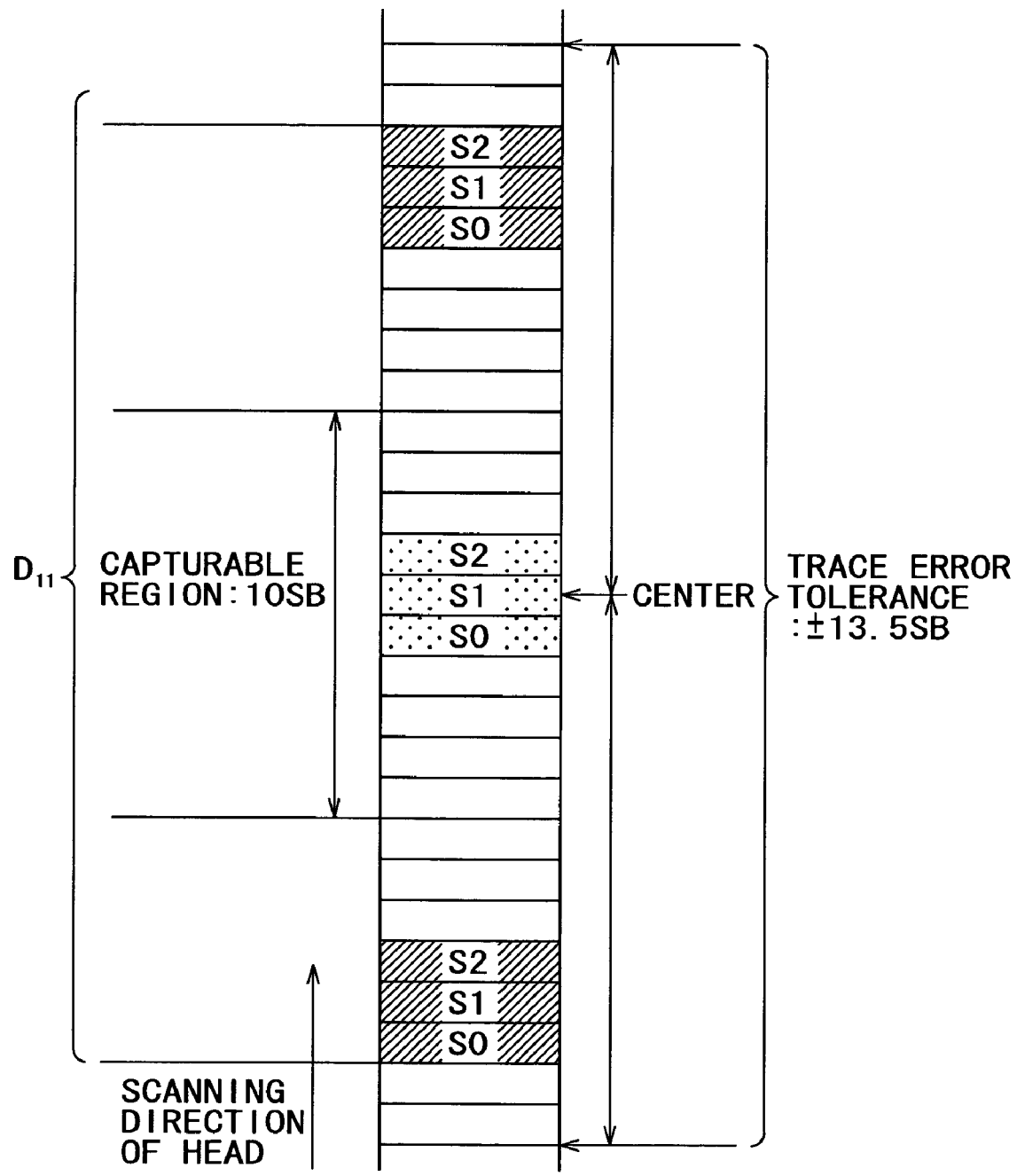
FIG. 13 is a view illustrating details of the data arrangement pattern shown in FIG. 11.

FIG. 13 illustrates the data D11 positioned on the track T1 in FIG. 11 (or the data D51 positioned on the track T5) from within the data for "+" sixteenfold speed reproduction. The data for "+" sixteenfold speed reproduction is repetitively recorded three times. Each piece of data is formed from 3 SBs of the sync blocks S0 to S2, and the individual data is spaced from each other by a distance corresponding to 7 SBs. While the number of sync blocks which can be acquired by one trace is 10, where such arrangement as described above is used, the tolerance of the error of a trace increases to ±13.5 SBs.

Figure 14:
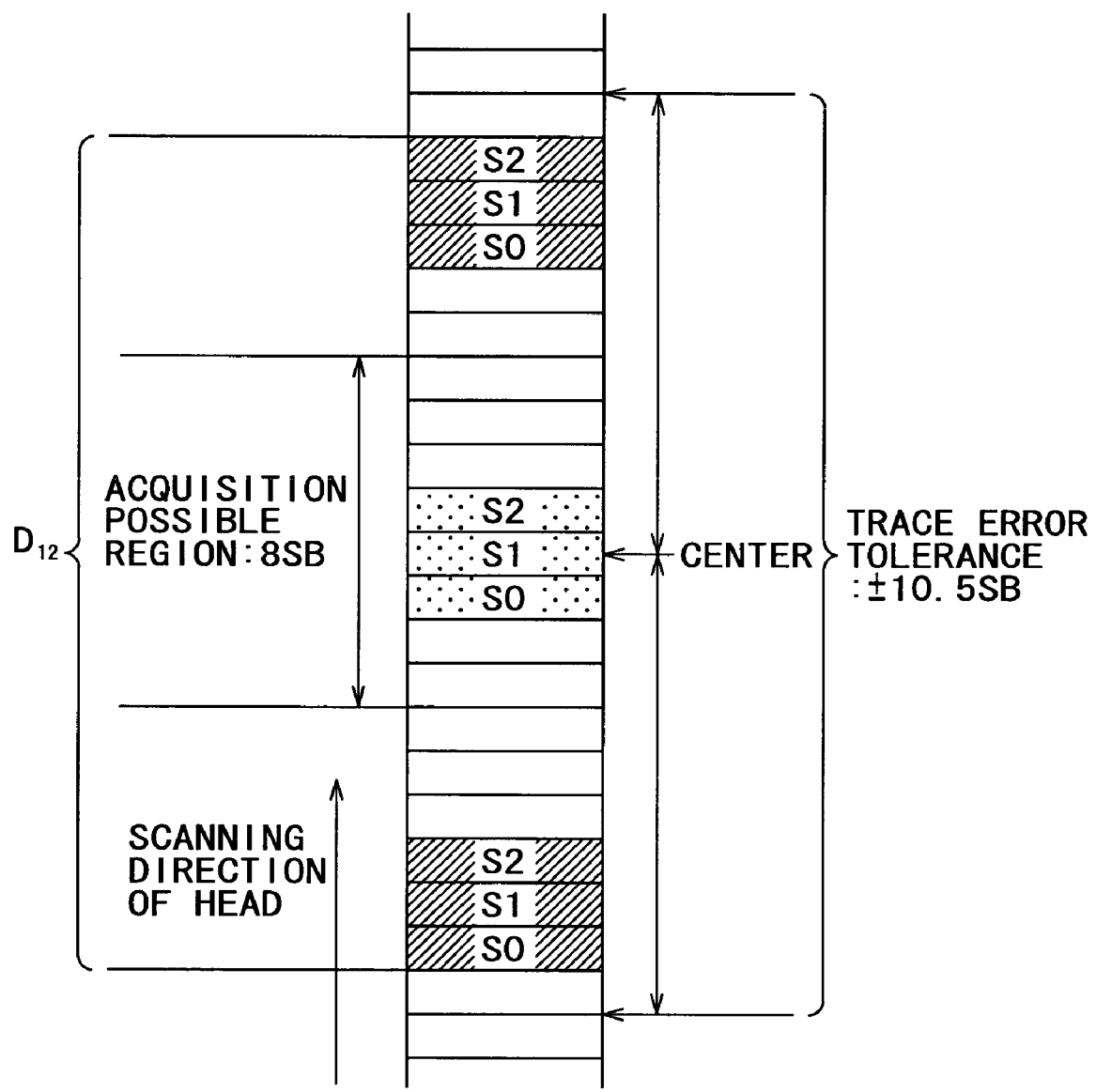
FIG. 14 is a view illustrating details of the data arrangement pattern shown in FIG. 11.

Similarly, FIG. 14 illustrates the data D12 positioned on the track T1 in FIG. 11 (or the data D52 positioned on the track T5) from within the data for "−" sixteenfold speed reproduction. The data for "−" sixteenfold speed reproduction is repetitively recorded three times. Each piece of the data is formed from 3 SBs of the sync blocks S0 to S2, and the individual data is spaced from each other by a distance corresponding to 5 SBs. While the number of sync blocks which can be acquired by one trace is 8, where such arrangement as described above is used, the tolerance of the error of a trace increases to ±10.5 SBs.

In the data arrangement shown in FIG. 13 or 14, the number of times of repetition is set to three and the data distance is increased to a rather great distance of 7 SBs or 5 SBs so that the tolerance against the error in a trace can be increased.

Figure 15:
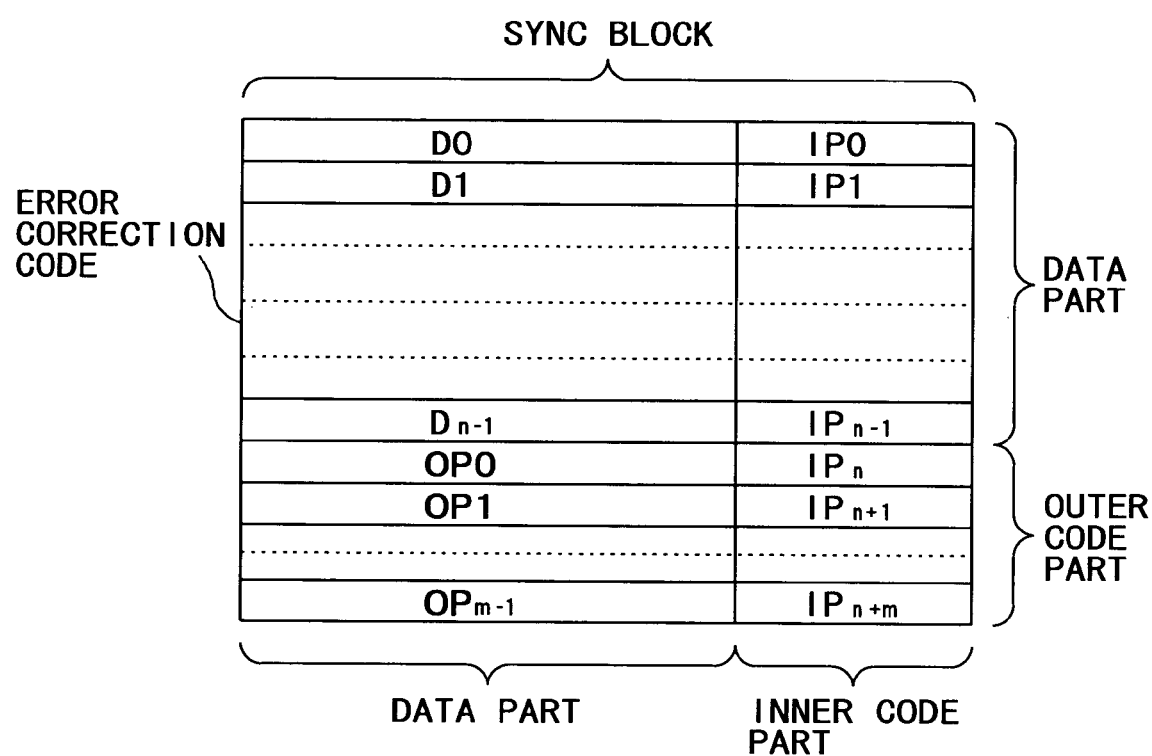
FIG. 15 is a view illustrating an error correction code.

Subsequently, error correction is described. As can be recognized from the configuration of the recording and reproduction apparatus 1 of FIG. 1, data such as image data and sound data is multiplexed by the data multiplexing section 4 and then error correction codes are added to resulting data by the error correction code addition section 6. A configuration of the error correction codes to be added is illustrated in FIG. 15. As seen in FIG. 15, one sync block is formed from a data part and an inner code part (Inner Parity), and an outer code part (Outer Parity) is added to one data part composed of a plurality of sync blocks. Where such a configuration as just described is taken, a high resisting property against an error in a unit of a sync block can be provided.

Generally, it is known that, where a tape-type medium is used as a recording medium, in addition to random errors (errors which appear non-periodically and in a single-shot manner), burst errors (errors which appear successively) are generated from defects of, damages to and so forth of a magnetic material applied to the tape. As a countermeasure against such burst errors, a single error correction outer code is provided for sync blocks to be recorded on a plurality of tracks, and the sync blocks are re-arranged (interleaved) over all of the tracks on which the sync blocks which form the code exist in accordance with a predetermined rule.

When high efficiency compression recoding is performed, if a recording signal process is performed in a unit of the interleave, then such a process as editing is facilitated and the scale of the recording and reproduction apparatus 1 can be reduced. Consequently, it is preferable that also a recording pattern of data for variable reproduction conforms to the interleave.

Subsequently, the image data production process for variable speed reproduction (the process at steps S4 and S5 of FIG. 6) in the standard mode is described.

Figure 16:
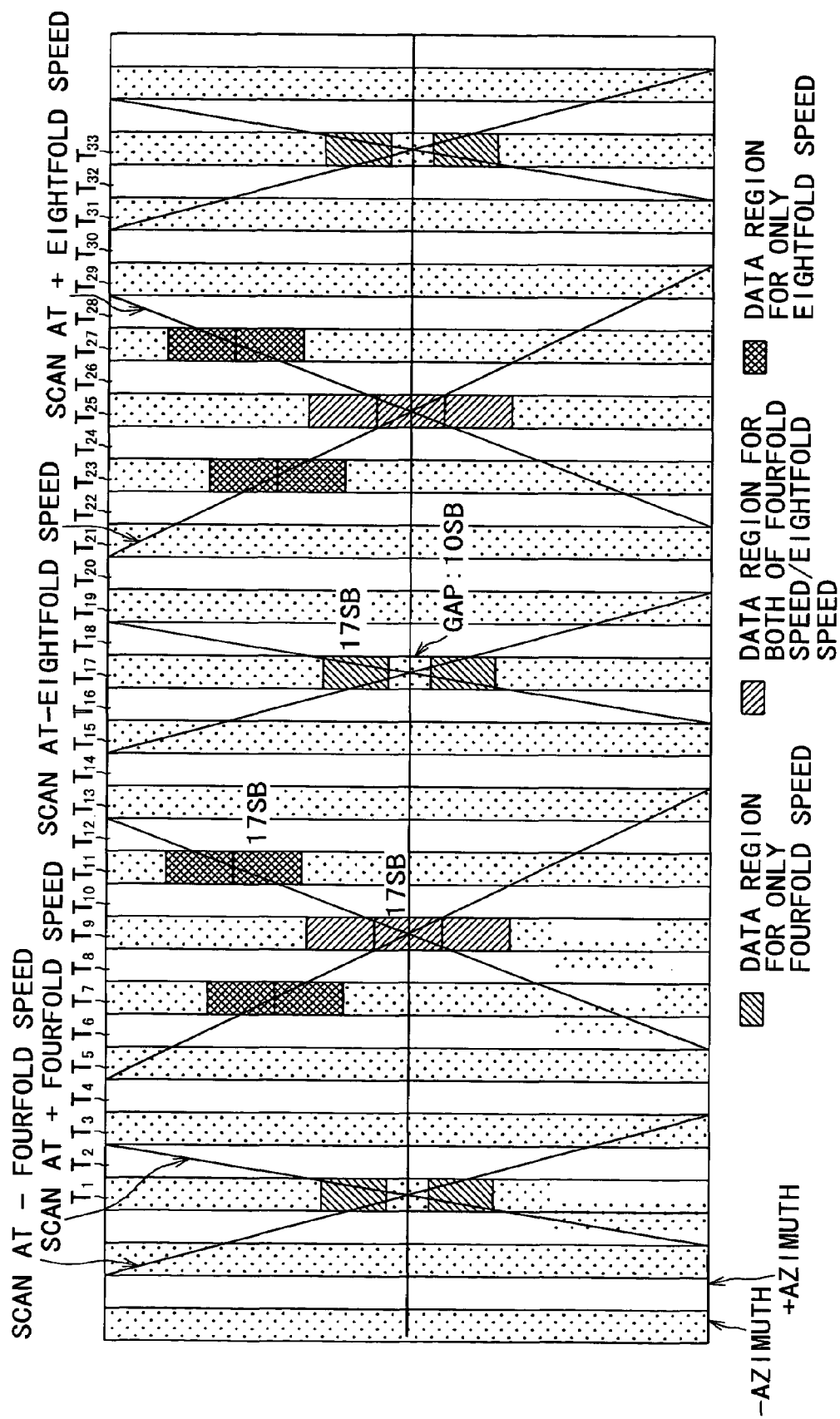
FIG. 16 is a view showing an example of data arrangement patterns of data for fourfold speed and eightfold speed reproduction in a standard mode.
Figure 17:
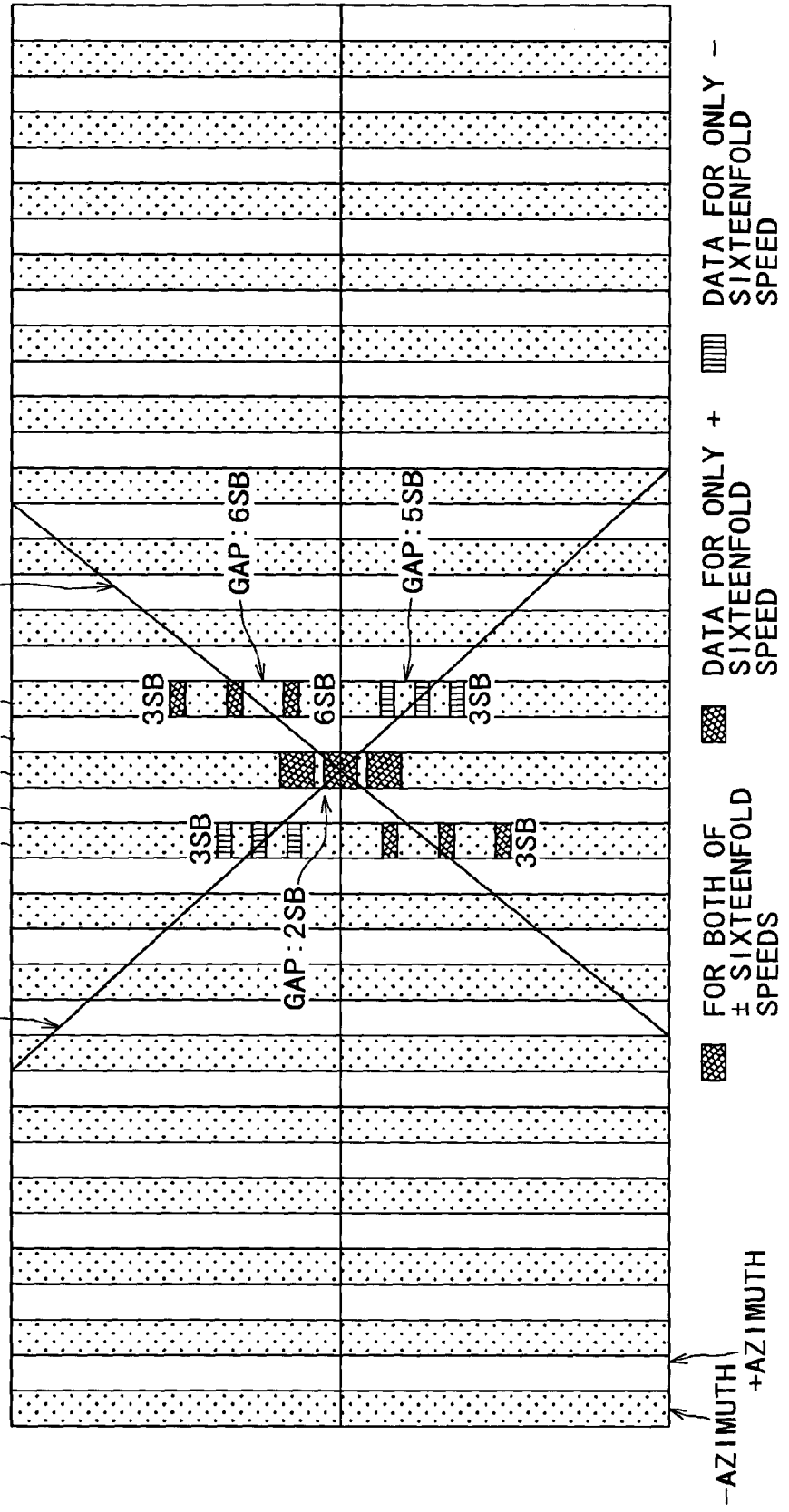
FIG. 17 is a view showing a further example of a data arrangement pattern of data for sixteenfold speed reproduction in the standard mode.
Figure 18:
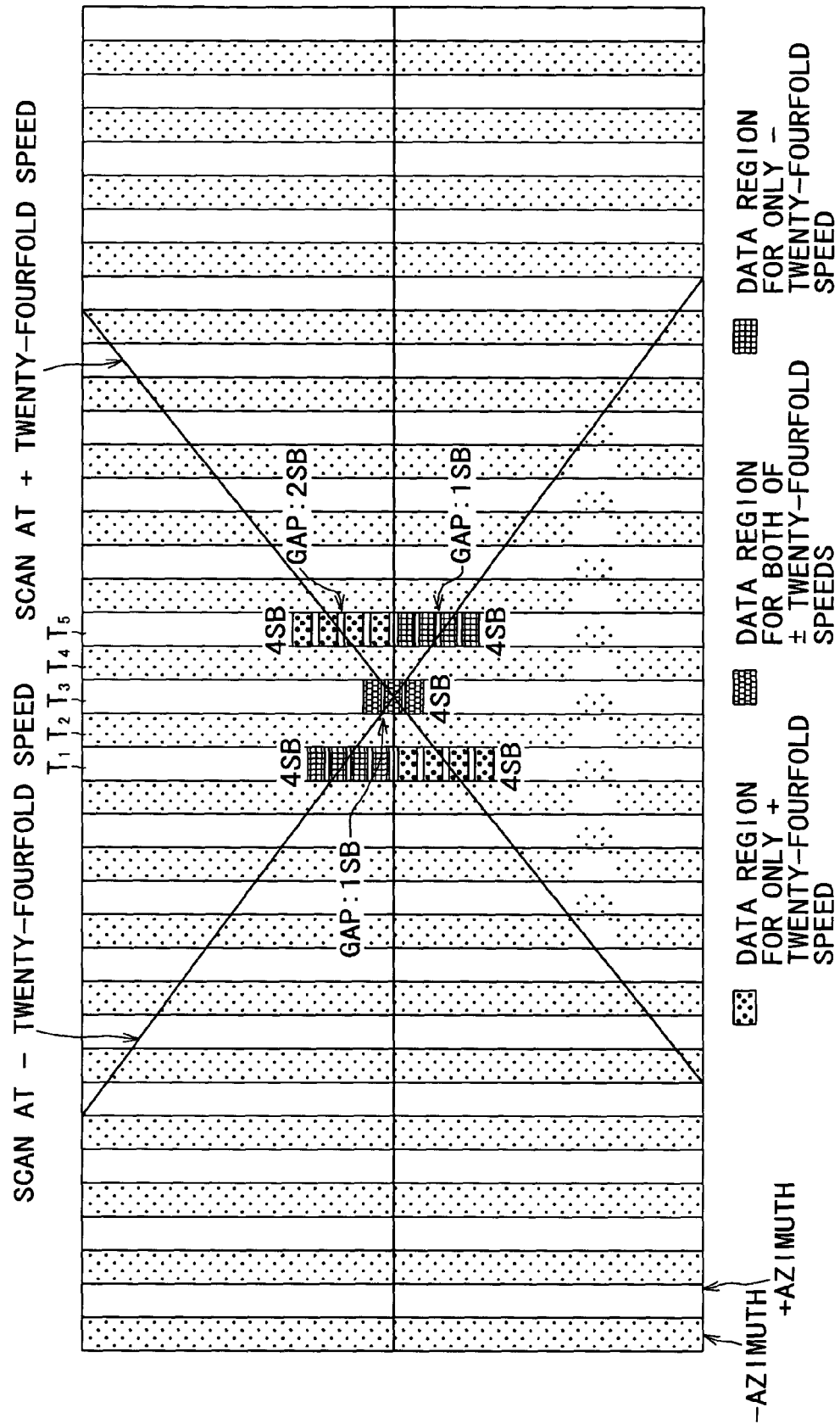
FIG. 18 is a view showing an example of a data arrangement pattern of data for twenty-fourfold speed reproduction in the standard mode.
Figure 19:
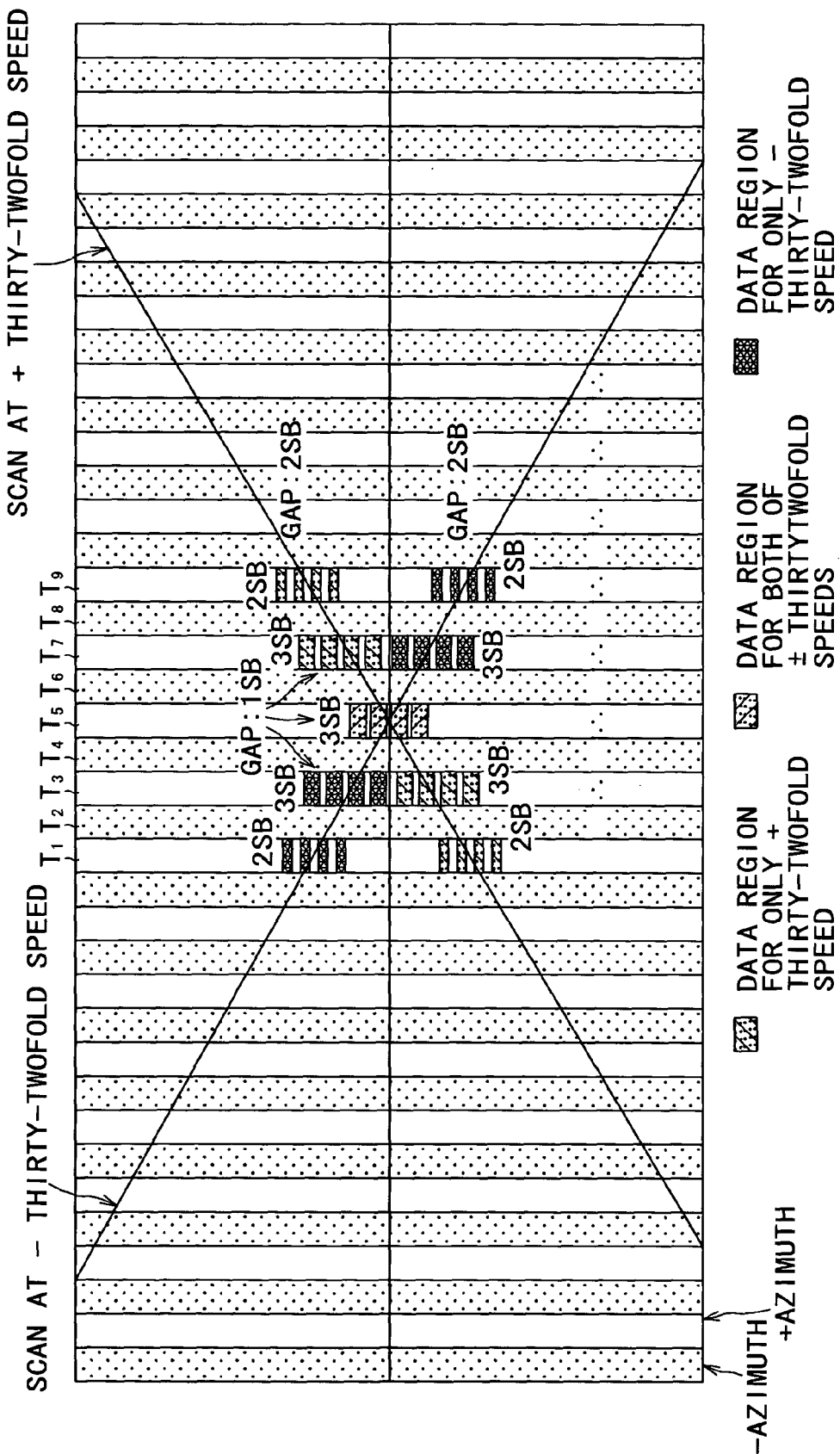
FIG. 19 is a view showing an example of a data arrangement pattern of data for thirty-twofold speed reproduction in the standard mode.

FIGS. 16 to 19 illustrate data arrangements for variable speed reproduction in the standard mode, and FIG. 16 illustrates a data arrangement for fourfold speed and eightfold speed reproduction; FIG. 17 illustrates a data arrangement for sixteenfold speed reproduction; FIG. 18 illustrates a data arrangement for twenty-fourfold speed reproduction; and FIG. 19 illustrates a data arrangement for thirty-twofold speed reproduction.

Two pieces of data present on each of tracks T1, T17 and T33 of FIG. 16 are digital image data for first region recording from within the data for the "±" fourfold speed. Each of the two pieces of data is the same data composed of 17 SBs and repetitively recorded twice with a gap of 10 SBs left therebetween in order to increase the trace error tolerance with respect to a region which can be acquired by a reproduction magnetic head.

Meanwhile, three pieces of data present on each of tracks T9 and T25 of FIG. 16 are digital image data for first region recording from within the data for the "±" eightfold speeds (for common use with the data for the "±" fourfold speeds). Each of the three pieces of data is the same data composed of 17 SBs and repetitively recorded three times without a gap left therebetween.

Further, two pieces of data present on each of tracks T11 and T27 of FIG. 16 are digital image data for second region recording from within the data only for the "+" eightfold speed. Each of the two pieces of data is the same data composed of 17 SBs and repetitively recorded twice without a gap left therebetween.

Furthermore, two pieces of data present on each of the tracks T7 and T23 of FIG. 16 are digital image data for second region recording from within the data only for the "−" eightfold speed. Each of the two pieces of data is the same data composed of 17 SBs and repetitively recorded twice without a gap left therebetween.

Three pieces of data present on the track T3 of FIG. 17 are digital image data for first region recording from within the data for the "±" sixteenfold speeds. Each of the three pieces of data is the same data composed of 6 SBs and repetitively recorded three times with a gap of 2 SBs left therebetween in order to increase the trace error tolerance with respect to a region which can be acquired by the reproduction magnetic head.

Meanwhile, three pieces of data only for the "+" sixteenfold speed present on each of the tracks T1 and T5 of FIG. 17 are digital image data for second region recording. Each of the three pieces of data is the same data composed of 3 SBs and repetitively recorded three times with a gap of 6 SBs left therebetween in order to increase the trace error tolerance with respect to a region which can be acquired by the reproduction magnetic head.

Three pieces of data only for the "−" sixteenfold speed present on each of the tracks T1 and T5 of FIG. 17 are digital image data for second region recording. Each of the three pieces of data is the same data composed of 3 SBs and repetitively recorded three times with a gap of 5 SBs left therebetween in order to increase the trace error tolerance with respect to a region which can be acquired by the reproduction magnetic head.

Three pieces of data present on the track T3 of FIG. 18 are digital image data for first region recording from within the data for the "±" twenty-fourfold speed. Each of the three pieces of data is the same data composed of 4 SBs and repetitively recorded three times with a gap of 1 SB left therebetween in order to increase the trace error tolerance with respect to a region which can be acquired by the reproduction magnetic head.

Meanwhile, four pieces of data only for the "+" twenty-fourfold speed present on each of the tracks T1 and T5 of FIG. 18 are digital image data for second region recording. Each of the four pieces of data is the same data composed of 4 SBs and repetitively recorded four times with a gap of 2 SBs left therebetween in order to increase the trace error tolerance with respect to a region which can be acquired by the reproduction magnetic head.

Four pieces of data only for the "−" twenty-fourfold speed present on each of the tracks T1 and T5 of FIG. 18 are digital image data for second region recording. Each of the four pieces of data is the same data composed of 4 SBs and repetitively recorded four times with a gap of 1 SB left therebetween in order to increase the trace error tolerance with respect to a region which can be acquired by the reproduction magnetic head.

Four pieces of data present on the track T5 of FIG. 19 are digital image data for first region recording from within the data for the "±" thirty-twofold speed. Each of the four pieces of data is the same data composed of 3 SBs and repetitively recorded four times with a gap of 1 SB left therebetween in order to increase the trace error tolerance with respect to a region which can be acquired by the reproduction magnetic head.

Four pieces of data only for the "+" thirty-twofold speed present on each of the tracks T1 and T9 of FIG. 19 are digital image data for second region recording. Each of the four pieces of data is the same data composed of 2 SBs and repetitively recorded four times with a gap of 2 SBs left therebetween in order to increase the trace error tolerance with respect to a region which can be acquired by the reproduction magnetic head.

Four pieces of data for only the "−" thirty-twofold speed present on each of the tracks T1 and T9 of FIG. 19 are digital image data for second region recording. Each of the four pieces of data is the same data composed of 2 SBs and repetitively recorded four times with a gap of 2 SBs left therebetween in order to increase the trace error tolerance with respect to a region which can be acquired by the reproduction magnetic head.

Four pieces of data only for the "+" thirty-twofold speed present on each of the tracks T3 and T7 of FIG. 19 are digital image data for second region recording. Each of the four pieces of data is the same data composed of 3 SBs and repetitively recorded four times with a gap of 1 SB left therebetween in order to increase the trace error tolerance with respect to a region which can be acquired by the reproduction magnetic head.

Four pieces of data only for the "−" thirty-twofold speed present on each of the tracks T3 and T7 of FIG. 19 are digital image data for second region recording. Each of the four pieces of data is the same data composed of 3 SBs and repetitively recorded four times with a gap of 1 SB left therebetween in order to increase the trace error tolerance with respect to a region which can be acquired by the reproduction magnetic head.

FIG. 20 illustrates a data arrangement for variable speed reproduction in the standard mode where the data arrangements of FIGS. 16 to 19 are collectively represented on a single drawing and besides the interleave is taken into consideration.

While the data arrangement patterns of FIGS. 16 to 20 described above are patterns where the standard mode (wherein the width of the reproduction magnetic head and the width of a recording track are substantially equal to each other) is supposed, if the tape running speed is decreased when compared with that in the standard mode, like in the long time mode, the range over which a track recorded once is overwritten by a next trace expands. As a result, the recording track width becomes smaller than the width of the recording magnetic head (and hence the width of the reproduction magnetic head corresponding to the recording magnetic head). If the width of the recording track becomes smaller than the width of the reproduction magnetic head, then since the crosstalk amount from neighboring tracks of the same azimuth upon reproduction increases, the overlap between RF envelopes becomes wider as shown at the upper stage of FIG. 21. Since this crosstalk originates from a track having the same azimuth, the range of data of the original track decreases as seen at the lower stage of FIG. 21, which disturbs detection of the data.

In such an instance as just described, the amount of data which can be acquired per one track by one trace, that is, the number of sync blocks which can be acquired, depends upon the crosstalk amount rather than the level of the main signal (reproduction signal from the original track).

If the width of the track becomes smaller than the width of the reproduction magnetic head in this manner (if the width of the reproduction magnetic head becomes great relative to the width of the track), then since number of sync blocks which can be acquired by one trace decreases when compared with that in the standard mode (where the width of the reproduction magnetic head and the width of the track are equal to each other), there is the possibility that a failure may occur in acquisition of data from such data arrangement patterns for the standard mode as shown in FIGS. 16 to 20.

Figure 22:
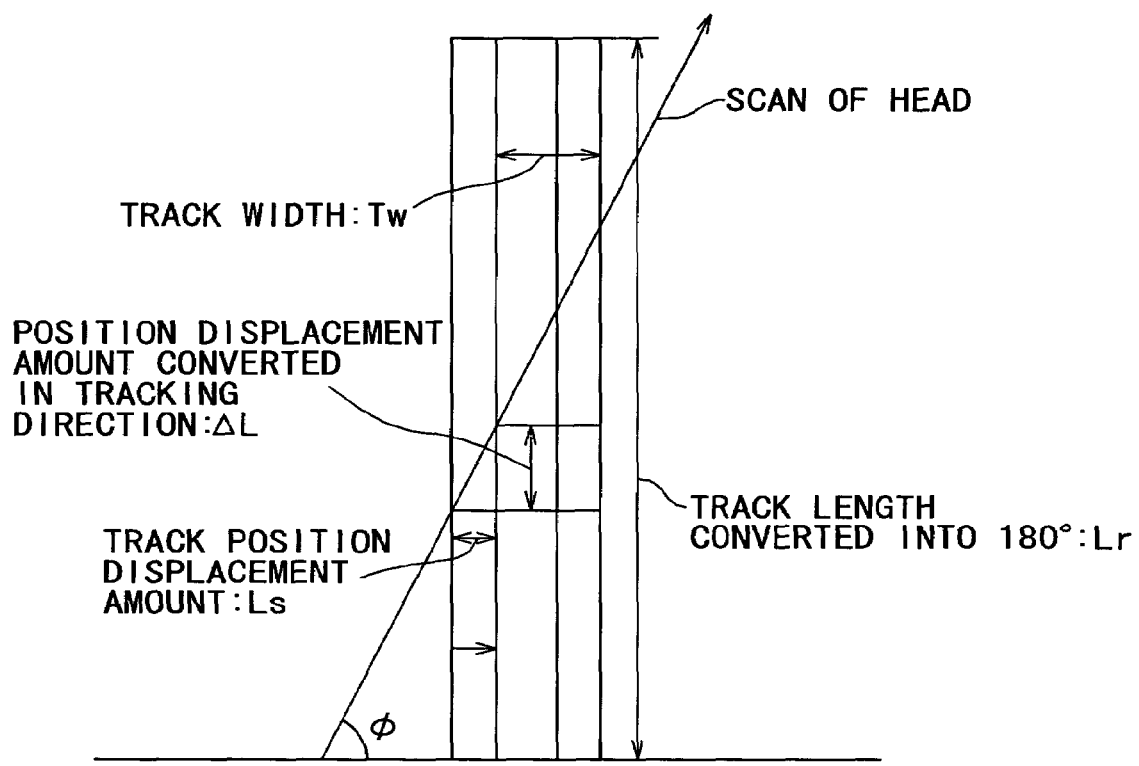
FIG. 22 is a view illustrating a relationship between a track pitch and a track position displacement.

FIG. 22 illustrates a relationship between the track pitch and the track position displacement. Here, where φ is the angle defined by the longitudinal direction of the magnetic tape and the scanning direction of the rotary head 8 and Ls is the track position displacement, the position displacement amount $\Delta L$ converted in the track direction is represented by the expression of $$\Delta L = Ls \tan \phi \qquad (1)$$

Further, where Tw is the track width, Lr is the track length converted in proportion to the angle of 180 degrees, and n is a speed magnification number, a relational expression of $$\tan \phi = Lr/\{Tw(n\pm 1)\} \qquad (2)$$

is satisfied. As can be apparently seen from the expressions (1) and (2), the value of the position displacement amount $\Delta L$ converted in the track direction increases as the track width Tw decreases.

Accordingly, the trace error amount when the recording position of a track is displaced by such a factor as jitters upon recording has a higher value as the recording track width decreases if the width of the recording magnetic head is fixed, and therefore, with such data arrangement patterns for the standard mode as shown in FIGS. 16 to 20, failure in acquisition of data sometimes occurs.

Figure 23:
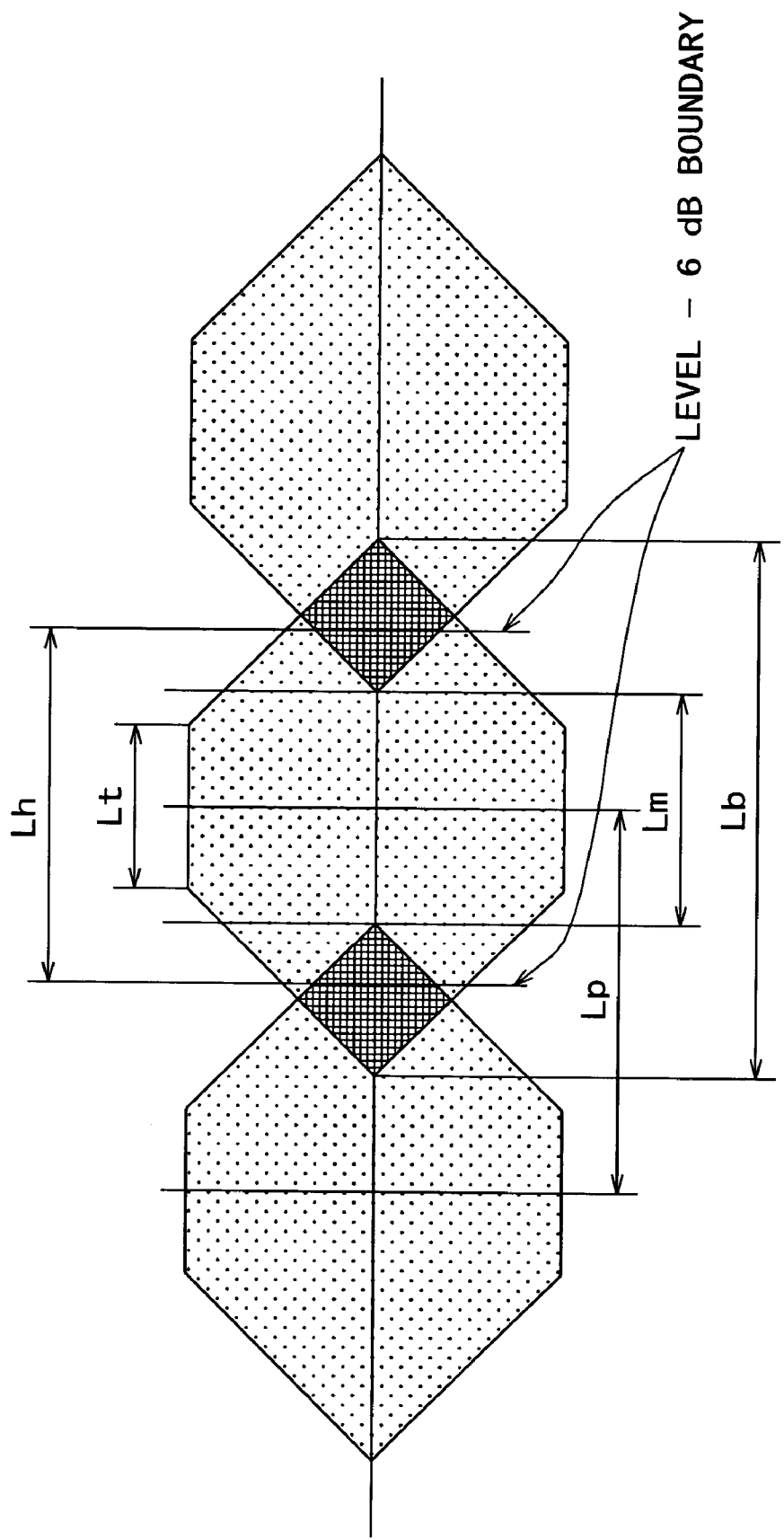
FIG. 23 is a view illustrating a relationship between the track widths of a recording magnetic head and a magnetic tape and the envelope of the RF signal.

FIG. 23 represents a relationship of the RF envelope to the width of the magnetic head (rotary head 8) and the width of the recording track. Where $\phi$ is the angle defined by the longitudinal direction of the magnetic tape and the scanning direction of the magnetic head, Ltr the track length, Twt the recording track width, n the speed magnification number, and Lp the RF envelope distance, the following expressions are satisfied:

$$\tan \phi = Ltr/\{Twt(n\pm 1)\} \qquad (3)$$

$$Lp = 2Twt \tan \phi \qquad (4)$$

Further, where the width of the top of the RF envelope is represented by Lt, the head width by Twh, the width of the bottom of the RF envelope by Lb, the RF envelope width at the level lower by 6 dB than the peak level by Lh, and the width of a region in which data can be acquired when crosstalk is present by Lm, the following expressions are satisfied:

$$Lt = (Twh - Twt) \tan \phi \qquad (5)$$

$$Lb = (Twh + Twt) \tan \phi \qquad (6)$$

$$Lh = Twh \tan \phi \qquad (7)$$

$$Lm = 2Lp - Lb \qquad (8)$$

While the number of sync blocks which are recorded in one area in one track (one of n areas formed when overwriting is performed n times) is determined from the number of sync blocks which can be acquired per one track by one trace, where the crosstalk amount from a track neighboring across one track and having the same azimuth cannot be ignored as seen in FIG. 21, the level at which crosstalk begins to be picked up is determined as a boundary and the inner side with respect to the boundary is determined as the width Lm of the data acquisition possible region as enlargedly shown in FIG. 23, for example.

It is to be noted, however, that the main signal can be detected actually if a narrower one of the range of the level higher than a certain fixed level (the RF envelope width Lh of the level lower by 6 dB than the peak level in FIG. 23) and the range in which no crosstalk is present (the data acquisition possible region width Lm where crosstalk is present in FIG. 23) is used as the data acquisition possible region.

From the expressions for determining the RF envelope width Lh at the level lower by 6 dB than the peak level and the data acquisition possible region width Lm where crosstalk is present as given by the expressions (7) and (8), it can be seen that Lh<Lm is satisfied when the relationship between the recording track width Twt and the head width Twh is Twt>(⅔)Twh. Therefore, in the present invention, when the recording track width is greater than ⅔ times the track width of the recording magnetic head, the range of the inner side of Lh (higher than −6 dB from the peak level) is determined as the data acquisition possible region, but when the recording track width is equal to or smaller than ⅔ times the track width of the recording magnetic head, the range on the inner side of Lm (range within which no crosstalk is present) is determined as the data acquisition possible region.

Once a data acquisition possible region is determined, the number of sync blocks which can be acquired per one track by one trace is determined, and consequently, also the number of sync blocks to be recorded in one area in one track is determined. In short, since the data acquisition possible region is narrowed with the crosstalk amount taken into consideration, the number of sync blocks which can be acquired per one track by one trace decreases. Consequently, it is possible to detect the main signal by reducing the number of sync blocks which are recorded in one area in one track.

Further, from the expressions (1) and (2), the position displacement amount $\Delta L$ converted in the track direction in accordance with the track width Tw, that is, the trace error amount (displacement amount from the trace target) is determined. Here, since the number of times of repetition of same data to be recorded in one area in a track depends upon the trace error amount in one trace, in order to allow detection of the main signal, the number of times of repetition should be increased as the position displacement amount $\Delta L$ converted in the track direction increases.

Data arrangements of FIGS. 24 to 27 represent patterns suitable for the long time mode with the foregoing taken into consideration for the patterns suitable for the standard mode shown in FIGS. 16 to 19. Further, FIG. 28 shows a data arrangement where the data arrangements of FIGS. 24 to 27 are collected in a single drawing and the interleave is taken into consideration.

Figure 24:
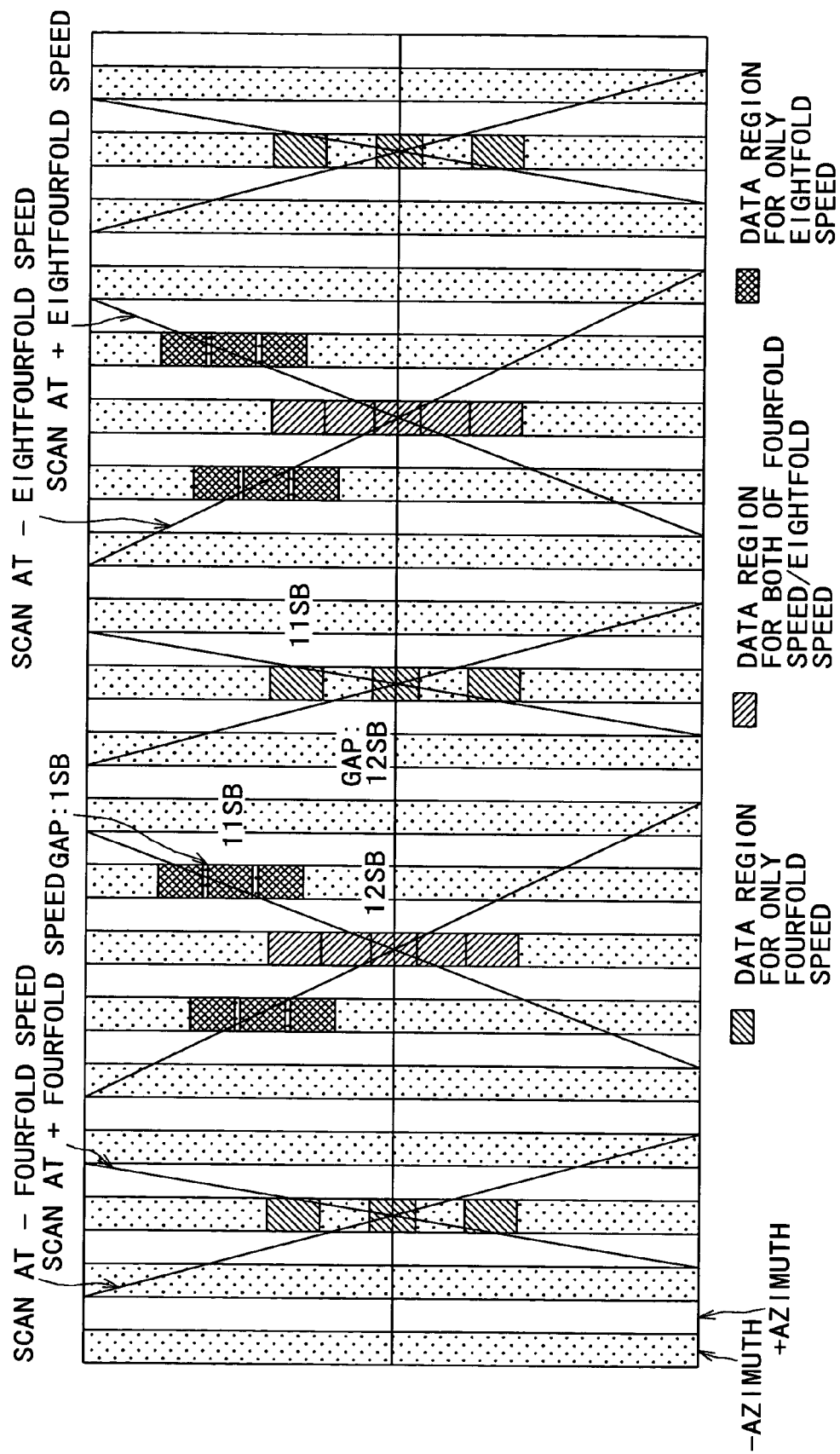
FIG. 24 is a view showing an example of a data arrangement pattern of data for fourfold speed and eightfold speed reproduction in a long time mode.

FIG. 24 is a view wherein arrangement patterns for "±" fourfold speed reproduction and for "±" eightfold speed reproduction are shown on the same drawing. As the data for the "±" fourfold speeds, data of 11 SBs is repetitively recorded three times only in the first region with a gap corresponding to 12 SBs left therebetween. Meanwhile, as the data for "±" eightfold speed reproduction, data of 12 SBs is repetitively recorded five times in the first region without a gap left therebetween, and data of 11 SBs is repetitively recorded three times in the second region with a gap corresponding to 1 SB left therebetween. In the pattern of the present case, when compared with the pattern suitable for the standard mode of FIG. 16, the number of sync blocks is smaller and the number of times of repetition is greater (this similarly applies also to FIGS. 25 to 28 as can be seen apparently from the comparison with FIGS. 17 to 20).

FIG. 25 is a view showing an arrangement pattern of data for "±" sixteenfold speed reproduction. As the data for "±" sixteenfold speed reproduction, data of 4 SBs is recorded four times in the first region with a gap corresponding to 2 SBs left therebetween and data of 2 SBs is recorded repetitively four times with a gap corresponding to 5 SBs left therebetween for the "+" sixteenfold speed and with a gap corresponding to 4 SBs left therebetween for the "−" sixteenfold speed.

FIG. 26 is a view showing an arrangement pattern of data for "±" twenty-fourfold speed reproduction. As the data for "±" twenty-fourfold speed reproduction, data of 4 SBs is repetitively recorded five times in the first region and data of 4 SBs is repetitively recorded five times in the second region both with no gap left therebetween.

FIG. 27 is a view showing an arrangement pattern of data for "±" thirty-twofold speed reproduction. As the data for "±" thirty-twofold speed reproduction, data of 2 SBs is repetitively recorded seven times with no gap left therebetween in the first region, but in the second region, data of 2 SBs is repetitively recorded eight times, or data of 1 SB is repetitively recorded eight times with a gap corresponding to 1 SB left therebetween.

FIG. 28 is a view wherein the arrangement patterns of data for "±" fourfold speed reproduction, "±" eightfold speed reproduction, "±" sixteenfold speed reproduction, "±" twenty-fourfold speed reproduction and "±" thirty-twofold speed reproduction shown in FIGS. 24 to 27 are shown on a single drawing. Further, the arrangement pattern shown in FIG. 28 is an arrangement pattern wherein the ECC interleave unit is taken into consideration. The regions for fourfold speed reproduction and the regions for eightfold speed reproduction are arranged at the shown positions in such a distance relationship that each of them is arranged at a place in each one ECC interleave unit. The regions for eightfold speed reproduction include also areas for fourfold speed reproduction and for common use.

The regions for sixteenfold speed reproduction are individually arranged at the shown positions in such a distance relationship that one of them is arranged at once place in two ECC interleave units; the regions for twenty-fourfold speed reproduction are individually arranged at the shown positions in such a distance relationship that one of them is arranged at one place in three ECC interleave units; and regions for thirty-twofold speed reproduction are individually arranged at the shown positions in such a distance relationship that one of them is arranged at one place in four ECC interleave units.

By reducing the number of sync blocks to be recorded in one area in one track and increasing the number of times of repetition of same data to record the data, a good variable speed reproduction output which does not exhibit a missing portion in image data can be obtained not only upon variable speed reproduction in a tape recorded where the recording track width is equal to the track width of the magnetic head as in the standard mode but also upon variable speed reproduction in another tape recorded where the recording track width is smaller than the track width of the magnetic head as in the long time mode. Further, a resisting property against deterioration of the quality similar to that in the standard mode where the quality deterioration is caused by a dispersion among different machines or a variation in environment can be achieved.

While the series of processes described above can be executed by hardware, it may otherwise be executed by software. Where the series of processes is executed by software, a program which constructs the software is installed from a recording medium into a computer incorporated in hardware for exclusive use or, for example, a personal computer for universal use which can execute various functions by installing various programs.

FIG. 29 is a view showing an example of an internal configuration of a personal computer for universal use. A CPU (Central Processing Unit) 101 of the personal computer executes various processes in accordance with a program stored in a ROM (Read Only Memory) 102. In a RAM (Random Access Memory) 103, data, programs and so forth necessary for the CPU 101 to execute various processes are stored suitably. An inputting section 106 composed of a keyboard, a mouse and so forth is connected to an input/output interface 105, and the input/output interface 105 outputs a signal inputted to the inputting section 106 to the CPU 101. Also an outputting section 107 composed of a display unit and a speaker or the like is connected to the input/output interface 105.

Further, a storage section 108 formed from a hard disk or the like, and a communication section 109 which performs transmission/reception of data to and from another apparatus through a network such as the Internet are connected to the input/output interface 105. A drive 110 is used to read out data from or write data into a recording medium such as a magnetic disk 121, an optical disk 122, a magneto-optical disk 123, and a semiconductor memory 124.

The recording medium is formed as a package medium such as, as shown in FIG. 29, a magnetic disk 121 (including a floppy disk), an optical disk 122 (including a CD-ROM (Compact Disc-Read Only Memory) and a DVD (Digital Versatile Disk)), or a magneto-optical disk 123 (including an MD (MiniDisc)), or a semiconductor memory 124 which has the program recorded thereon or therein and is distributed in order to provide the program to a user separately from an apparatus body. Else, the recording medium is formed as a ROM 102 having the program stored therein, a hard disk included in the storage section 108, or the like which are provided to a user in a state wherein they are incorporated in the computer in advance.

It is to be noted that, in the present specification, the steps which describe the program provided through a medium may be but need not necessarily be processed in a time series in the order as described, and include processes which are executed in parallel or individually without being processed in a time series.

INDUSTRIAL APPLICABILITY

According to the present invention, digital image data sufficient to allow a good image to be displayed upon variable speed reproduction in a long time mode can be recorded.

The invention claimed is:

1. A magnetic tape recording apparatus for recording compressed digital image data onto a track of a magnetic tape by means of a rotary head, comprising:
   inputting means for inputting the digital image data;
   extraction means for extracting digital image data for variable speed reproduction from the digital image data inputted by said inputting means;
   production means for producing, from the digital image data extracted by the extraction means, digital image recording data for variable speed reproduction to be recorded into predetermined areas of a first region positioned substantially at the center of the track and a second region positioned at a position which is traced upon variable speed reproduction in a track positioned in the neighborhood of the track; and
   recording means for recording the digital image recording data for variable speed reproduction produced by said production means into the first and second regions,
   wherein said first region comprises three pieces of digital image data recorded at eightfold speed, each of said three pieces of digital image data being data composed of 17 SBs and repetitively recorded three times without a gap left therebetween,
   wherein said second region comprises two pieces of digital image data recorded at eightfold speed, each of said two pieces of digital image data being data composed of 17 SBs and repetitively recorded twice without a gap left therebetween.

2. A magnetic tape recording method of recording compressed digital image data onto a track of a magnetic tape by means of a rotary head, comprising:

an inputting step of inputting the digital image data;
an extraction step of extracting digital image data for variable speed reproduction from the digital image data inputted by the process at the inputting step;
a production step of producing, from the digital image data extracted by the extraction step, digital image recording data for variable speed reproduction to be recorded into predetermined areas of a first region positioned substantially at the center of the track and a second region positioned at a position which is traced upon variable speed reproduction in a track positioned in the neighborhood of the track; and
a recording step of recording the digital image recording data for variable speed reproduction produced by the process at the production step into the first and second regions, wherein said first region comprises three pieces of digital image data recorded at eightfold speed, each of said three pieces of digital image data being data composed of 17 SBs and repetitively recorded three times without a gap left therebetween,
wherein said second region comprises two pieces of digital image data recorded at eightfold speed, each of said two pieces of digital image data being data composed of 17 SBs and repetitively recorded twice without a gap left therebetween.

3. A computer-readable medium on which a computer-readable program for a magnetic tape recording apparatus for recording compressed digital image data onto a track of a magnetic tape by means of a rotary head is recorded, the program comprises:

an inputting control step of controlling inputting of the digital image data;
an extraction step of extracting digital image data for variable speed reproduction from the digital image data whose inputting is controlled by the process at the inputting control step;
a production step of producing, from the digital image data extracted by the extraction step, digital image recording data for variable speed reproduction to be recorded into predetermined areas of a first region positioned substantially at the center of the track and a second region positioned at a position which is traced upon variable speed reproduction in a track positioned in the neighborhood of the track; and
a recording step of recording the digital image recording data for variable speed reproduction produced by the process at the production step into the first and second regions, wherein said first region comprises three pieces of digital image data recorded at eightfold speed, each of said three pieces of digital image data being data composed of 17 SBs and repetitively recorded three times without a gap left therebetween,
wherein said second region comprises two pieces of digital image data recorded at eightfold speed, each of said two pieces of digital image data being data composed of 17 SBs and repetitively recorded twice without a gap left therebetween.

4. A magnetic tape recording apparatus for recording compressed digital image data onto a track of a magnetic tape by means of a rotary head, comprising:

inputting means for inputting the digital image data;
extraction means for extracting digital image data for variable speed reproduction from the digital image data inputted by said inputting means;
production means for producing, from the digital image data extracted by the extraction means, digital image recording data for variable speed reproduction to be recorded into predetermined areas of a first region positioned substantially at the center of the track and a second region positioned at a position which is traced upon variable speed reproduction in a track positioned in the neighborhood of the track; and
recording means for recording the digital image recording data for variable speed reproduction produced by said production means into the areas of the first and second regions,
wherein said first region comprises three pieces of digital image data recorded at eightfold speed, each of said three pieces of digital image data being data composed of 17 SBs and repetitively recorded three times without a gap left therebetween,
wherein said second region comprises two pieces of digital image data recorded at eightfold speed, each of said two pieces of digital image data being data composed of 17 SBs and repetitively recorded twice without a gap left therebetween.

5. A magnetic tape recording method of recording compressed digital image data onto a track of a magnetic tape by means of a rotary head, comprising:

an inputting step of inputting the digital image data;
an extraction step of extracting digital image data for variable speed reproduction from the digital image data inputted by the process at the inputting step;
a production step of producing, from the digital image data extracted by the extraction step, digital image recording data for variable speed reproduction to be recorded into a predetermined area of a first region positioned substantially at the center of the track and a second region positioned at a position which is traced upon variable speed reproduction in a track positioned in the neighborhood of the track; and
a recording step of recording the digital image recording data for variable speed reproduction produced by the process at the production step into the areas of the first and second regions,
wherein said first region comprises three pieces of digital image data recorded at eightfold speed, each of said three pieces of digital image data being data composed of 17 SBs and repetitively recorded three times without a gap left therebetween,
wherein said second region comprises two pieces of digital image data recorded at eightfold speed, each of said two pieces of digital image data being data composed of 17 SBs and repetitively recorded twice without a gap left therebetween.

6. A computer-readable medium on which a computer-readable program for a magnetic tape recording apparatus for recording compressed digital image data in a standard mode or a long time mode onto a track of a magnetic tape by means of a rotary head is recorded, the program comprises:

an inputting control step of controlling inputting of the digital image data;
an extraction step of extracting digital image data for variable speed reproduction from the digital image data whose inputting is controlled by the process at the inputting control step;
a production step of producing, from the digital image data extracted by the extraction step, digital image recording data for variable speed reproduction to be recorded into predetermined areas of a first region positioned substantially at the center of the track and a second region positioned at a position which is traced upon variable speed reproduction in a track positioned in the neighborhood of the track; and a recording step of recording the digital image recording data for variable speed reproduction produced by the process at the production step into the areas of the first and second regions, wherein said first region comprises three pieces of digital image data recorded at eightfold speed, each of said three pieces of digital image data being data composed of 17 SBs and repetitively recorded three times without a gap left therebetween, wherein said second region comprises two pieces of digital image data recorded at eightfold speed, each of said two pieces of digital image data being data composed of 17 SBs and repetitively recorded twice without a gap left therebetween.

* * * * *